United States Patent
Won et al.

(10) Patent No.: US 11,650,640 B2
(45) Date of Patent: May 16, 2023

(54) DISPLAY DEVICE INCLUDING HEAT-DISSIPATING MEMBER AND SOUND GENERATOR

(71) Applicant: SAMSUNG DISPLAY CO., LTD., Yongin-si (KR)

(72) Inventors: Byeong Hee Won, Incheon (KR); Jung Hun Noh, Yongin-si (KR); Yi Joon Ahn, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 164 days.

(21) Appl. No.: 16/727,052

(22) Filed: Dec. 26, 2019

(65) Prior Publication Data

US 2020/0233469 A1    Jul. 23, 2020

(30) Foreign Application Priority Data

Jan. 17, 2019    (KR) ........................ 10-2019-0006119

(51) Int. Cl.
*G06F 1/20*    (2006.01)
*G06F 1/16*    (2006.01)
(Continued)

(52) U.S. Cl.
CPC ............ *G06F 1/203* (2013.01); *G06F 1/1688* (2013.01); *H04M 1/0202* (2013.01); *H05K 7/2039* (2013.01); *H05K 7/20963* (2013.01)

(58) Field of Classification Search
CPC ....... G02F 1/1333–133328; G02F 1/16; G02F 1/203; G02F 1/1613; G02F 1/1626; G02F 1/1637; G02F 1/1652; G02F 1/1688; H05K 5/02; H05K 5/03; H05K 5/0004–0021; H05K 5/0217; H05K 7/2039; H05K 7/20454; H05K 7/20472; H05K 7/20509; H05K 7/20954; H05K 7/20127; H01L 51/5237; H01L 51/529; H01L 51/56;
(Continued)

(56) References Cited

U.S. PATENT DOCUMENTS

2004/0169786 A1* 9/2004 Yamazaki ......... G02F 1/133305
  349/61
2013/0200732 A1* 8/2013 Jun ........................ H02K 33/16
  310/25

(Continued)

FOREIGN PATENT DOCUMENTS

JP    2004-173264    6/2004
KR    10-0863188    10/2008
(Continued)

*Primary Examiner* — Zachary Pape
*Assistant Examiner* — Amir A Jalali
(74) *Attorney, Agent, or Firm* — F. Chau & Associate, LLC

(57) ABSTRACT

A display device includes a display panel, and a heat-dissipating member disposed on the display panel and including a conductive metal. The display device further includes a sound generator disposed on the heat-dissipating member and generating sound by vibrating the display panel and the heat-dissipating member. The display device additionally includes a display circuit board disposed on the heat-dissipating member. The heat-dissipating member includes openings and a first line formed in the openings, and the first line electrically connects the sound generator with the display circuit board.

21 Claims, 30 Drawing Sheets

(51) Int. Cl.
*H04M 1/02* (2006.01)
*H05K 7/20* (2006.01)

(58) Field of Classification Search
CPC .......... G09F 2013/222; H04M 1/0202; H04M 1/026; H04M 1/0266; H04M 1/03; H04R 7/045; H04R 7/00; H04R 2499/11; H04B 1/036
See application file for complete search history.

(56) References Cited

U.S. PATENT DOCUMENTS

| | | | | |
|---|---|---|---|---|
| 2013/0303243 | A1* | 11/2013 | Park | H04M 1/026 |
| | | | | 455/575.7 |
| 2013/0314920 | A1* | 11/2013 | Park | H01L 23/3677 |
| | | | | 362/249.02 |
| 2017/0280217 | A1* | 9/2017 | Choi | H04R 9/066 |
| 2017/0280249 | A1* | 9/2017 | Choi | H04R 9/066 |
| 2019/0037164 | A1* | 1/2019 | Kim | H04R 17/005 |
| 2019/0116405 | A1* | 4/2019 | Noh | G02F 1/13338 |
| 2019/0196589 | A1* | 6/2019 | Shim | G06F 3/016 |
| 2019/0268681 | A1* | 8/2019 | Masuda | H04M 1/035 |
| 2020/0177999 | A1 | 6/2020 | Ahn | |
| 2021/0089257 | A1* | 3/2021 | Maeshiba | H04S 5/005 |
| 2021/0092528 | A1* | 3/2021 | Lee | H04R 17/00 |
| 2021/0191552 | A1* | 6/2021 | Bok | H01L 51/5246 |

FOREIGN PATENT DOCUMENTS

| | | |
|---|---|---|
| KR | 10-2019-0076080 | 7/2019 |
| KR | 10-2019-0090106 | 8/2019 |
| KR | 10-2019-0126955 | 11/2019 |
| KR | 10-2020-0066442 | 6/2020 |

* cited by examiner

FIG. 14
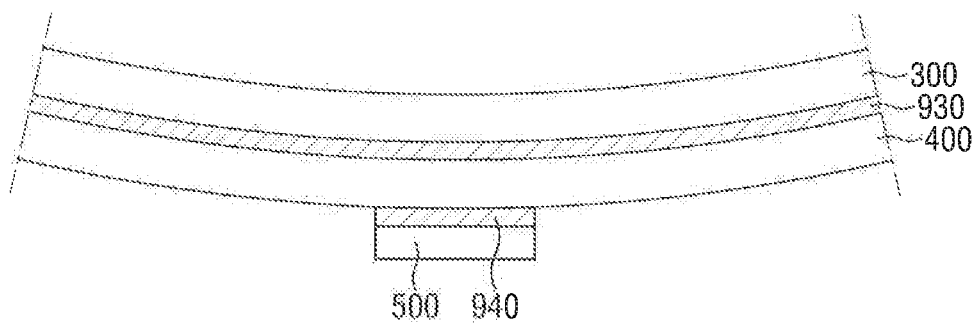
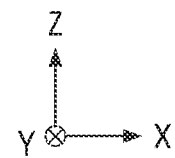

DISPLAY DEVICE INCLUDING HEAT-DISSIPATING MEMBER AND SOUND GENERATOR

CROSS-REFERENCE TO RELATED APPLICATION

This application claims priority under 35 U.S.C. § 119 to Korean Patent Application No. 10-2019-0006119 filed on Jan. 17, 2019, in the Korean Intellectual Property Office, the disclosure of which is incorporated by reference herein in its entirety.

TECHNICAL FIELD

The present invention relates to a display device, and more particularly, to a display device including a sound generator.

DISCUSSION OF THE RELATED ART

As the information-oriented society evolves, demand for display devices increases. For example, display devices are included in a variety of electronic devices such as smart phones, digital cameras, laptop computers, navigation devices, and smart televisions. Display devices may include a display panel for displaying an image and a sound generator for providing sound. For example, in a smartphone, a sound generator may output a person's voice who a user is communicating with through the smartphone.

As display devices are used by various electronic devices, display devices may have various designs. For example, a display device for a smartphone may have a wider display area by eliminating a sound generator from the front face of the smartphone.

SUMMARY

According to an exemplary embodiment of the present invention, a display device includes: a display panel; a heat-dissipating member disposed on the display panel and including a conductive metal; a sound generator disposed on the heat-dissipating member and generating sound by vibrating the display panel and the heat-dissipating member; and a display circuit board disposed on the heat-dissipating member, wherein the heat-dissipating member includes openings and a first line formed in the openings, and the first line electrically connects the sound generator with the display circuit board.

In an exemplary embodiment of the present inventive concept, the first line has a shape corresponding to a shape of the openings.

In an exemplary embodiment of the present inventive concept, the display device further includes a plurality of lines, wherein the plurality of lines includes the first line and a second line spaced apart from the first line. The sound generator includes a first electrode and a second electrode. First ends of the first line and the second line are electrically connected to the first electrode and the second electrode, respectively.

In an exemplary embodiment of the present inventive concept, the display circuit board includes a first pad and a second pad spaced apart from each other, and second ends, opposite the first ends, of the first line and the second line are electrically connected to the first pad and the second pad, respectively.

In an exemplary embodiment of the present inventive concept, the display circuit board further includes a third pad spaced apart from the first pad and the second pad. The heat-dissipating member further includes a base portion spaced apart from the first line and the second line, and the third pad is grounded to the base portion.

In an exemplary embodiment of the present inventive concept, the display circuit board further includes a sound driver configured to output a first driving voltage and a second driving voltage. The first driving voltage is applied to the first electrode via the first pad and the first line, and the second driving voltage is applied to the second electrode via the second pad and the second line.

In an exemplary embodiment of the present inventive concept, the first electrode and the second electrode protrude from the sound generator, and the sound generator includes a vibration layer disposed between the first electrode and the second electrode and configured to contract and expand according to the first driving voltage applied to the first electrode and the second driving voltage applied to the second electrode.

In an exemplary embodiment of the present inventive concept, the first electrode includes a first stem electrode and first branch electrodes extending from the first stem electrode. The second electrode includes a second stem electrode and second branch electrodes extending from the second stem electrode and extending parallel to the first branch electrodes.

In an exemplary embodiment of the present inventive concept, the first branch electrodes and the second branch electrodes are alternately arranged in a direction parallel to a first side of the first stem electrode.

In an exemplary embodiment of the present inventive concept, an end of each of the first stem electrode and the second stem electrode protrudes out of the vibration layer.

In an exemplary embodiment of the present inventive concept, the display device further includes an anisotropic conductive film disposed between the sound generator and the heat-dissipating member.

In an exemplary embodiment of the present inventive concept, the anisotropic conductive film includes a binder and conductive particles. The conductive particles overlap the first electrode and the second electrode.

In an exemplary embodiment of the present inventive concept, the heat-dissipating member further includes a base portion spaced apart from the first line. The sound generator includes a first electrode and a second electrode, wherein the first electrode is electrically connected to a first end of the first line, and the second electrode is grounded to the base portion.

In an exemplary embodiment of the present inventive concept, the display circuit board includes a plurality of pads spaced apart from one another, wherein a second end, opposite the first end, of the first line is electrically connected to a first pad of the plurality of pads, and a second pad of the plurality of pads is grounded to the base portion.

In an exemplary embodiment of the present inventive concept, a driving voltage is applied to the first electrode of the sound generator through the first line, and a ground voltage is applied to the second electrode through the base portion.

In an exemplary embodiment of the present inventive concept, the sound generator includes a vibration layer disposed between the first electrode and the second electrode and is configured to contract and expand according to the driving voltage applied to the first electrode.

In an exemplary embodiment of the present inventive concept, the display device further includes: a buffer member disposed between the display panel and the heat-dissipating member; and a film layer disposed between the buffer member and the heat-dissipating member, wherein the film layer includes a pattern groove overlapping the openings.

In an exemplary embodiment of the present inventive concept, the display device further includes: a buffer member disposed between the display panel and the heat-dissipating member; a film layer disposed between the buffer member and the heat-dissipating member; and a shielding member disposed between the film layer and the heat-dissipating member, wherein the shielding member includes a hole overlapping with a first opening of the openings of the heat-dissipating member.

In an exemplary embodiment of the present inventive concept, the display device further includes: a middle frame disposed on the heat-dissipating member and having a through hole; and a main circuit board disposed on the middle frame and including a main connector.

In an exemplary embodiment of the present inventive concept, the display circuit board further includes a connection cable, and wherein the connection cable is connected to the main connector of the main circuit board via the through hole of the middle frame.

According to an exemplary embodiment of the present inventive concept, a display device includes: a display panel; a display circuit board connected to the display panel and including a display driver and a sound driver; a cover panel member disposed on the display panel and including a heat-dissipating member, wherein the heat-dissipating member includes a conductive metal, an opening and a first line disposed in the opening; and a sound generator disposed on the heat-dissipating member and configured to expand and contract. The first line electrically connects the sound generator to the to the display circuit board and the sound driver.

BRIEF DESCRIPTION OF THE DRAWINGS

The above and other features of the present invention will become more apparent by describing in detail exemplary embodiments thereof, with reference to the accompanying drawings, in which:

FIGS. 14 and 15 are views showing a way of vibrating the display panel by the vibration of the sound generator, according to an exemplary embodiment of the present invention;

DETAILED DESCRIPTION OF THE EMBODIMENTS

Figure 1:
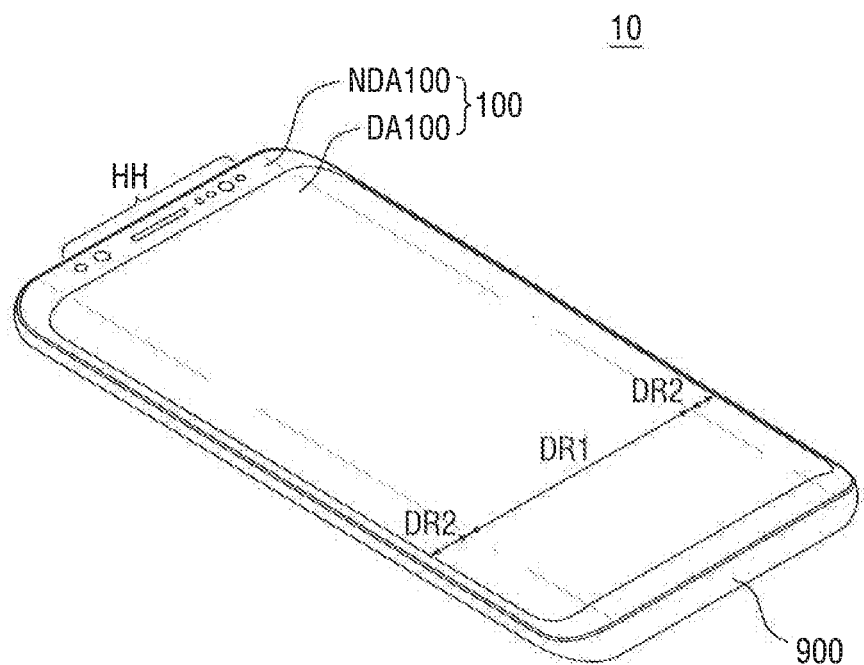
FIG. 1 is a perspective view of a display device according to an exemplary embodiment of the present invention.

Exemplary embodiments of the present invention will be described more fully hereinafter with reference to the accompanying drawings. The present invention may, however, be embodied in many different forms and should not be construed as being limited to the exemplary embodiments disclosed herein. The same reference numerals may refer to the same or like elements throughout the specification, and thus their descriptions may be omitted.

It will be understood that when an element or layer is referred to as being "on", "connected to" or "coupled to" another element or layer, the element can be directly on, connected or coupled to the other element or layer or intervening elements or layers may be present.

Hereinafter, exemplary embodiments of the present invention will be described with reference to the accompanying drawings.

Figure 2:
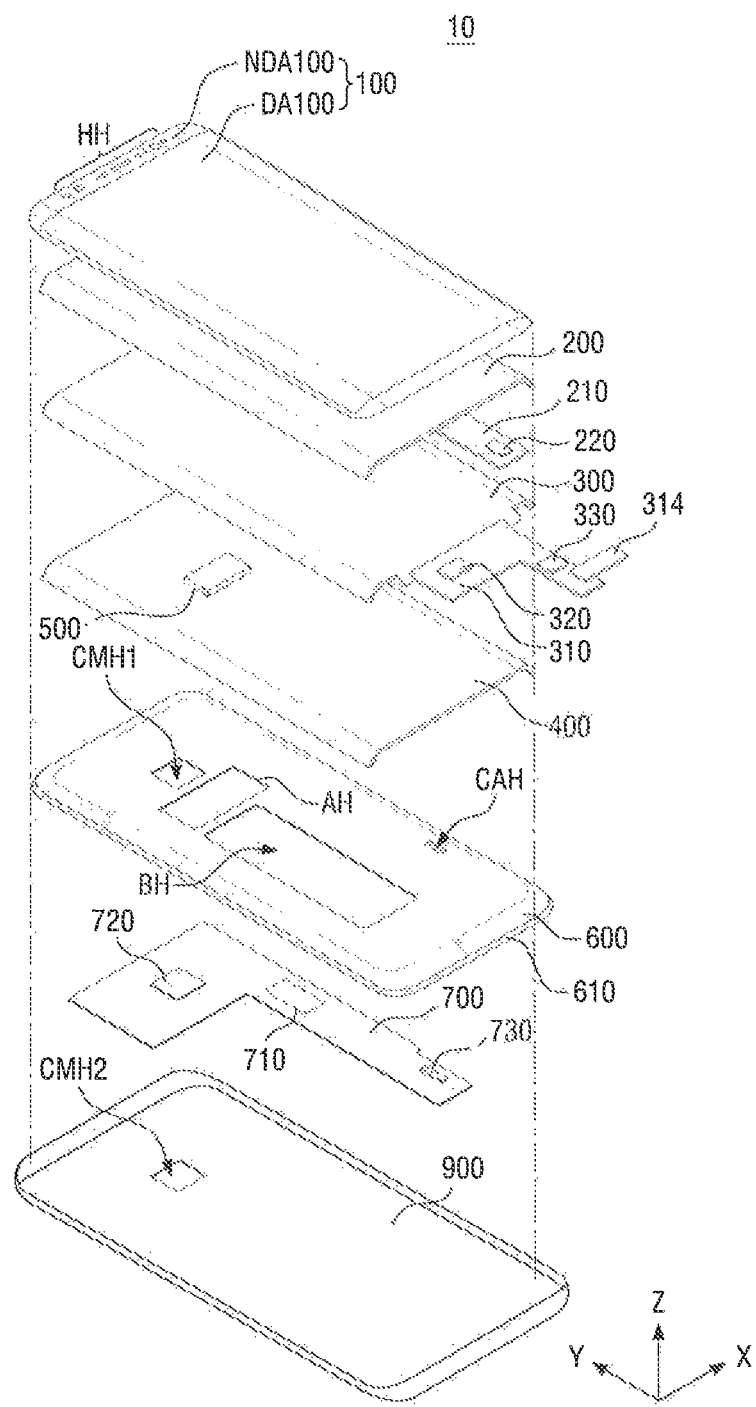
FIG. 2 is an exploded perspective view of a display device according to an exemplary embodiment of the present invention.

FIG. 1 is a perspective view of a display device according to an exemplary embodiment of the present invention. FIG. 2 is an exploded perspective view of a display device according to an exemplary embodiment of the present invention.

Referring to FIGS. 1 and 2, a display device 10 according to an exemplary embodiment of the present invention includes a cover window 100, a touch sensing device 200, a touch circuit board 210, a touch driver 220, a display panel 300, a display circuit board 310, a display driver 320, a cover panel member 400, a sound generator 500, a middle frame 600, a main circuit board 700, and a bottom cover 900.

As used herein, the terms "above," "top" and "upper surface" may refer to the surface of the display panel 300 in the z-axis direction where the cover window 100 is disposed, whereas the terms "below," "bottom" and "lower surface" may refer to the opposite surface of the display panel 300 in the z-axis direction where the middle frame 600 is disposed. As used herein, the terms "left," "right," "upper" and "lower" may indicate relative positions when the display panel 300 is viewed from the top. For example, the "left side" may refer to the opposite direction (e.g., the negative x-axis direction) indicated by the arrow of the x-axis, the "right side" may refer to the direction indicated by the arrow of the x-axis, the "upper side" may refer to the direction indicated by the arrow of the z-axis, and the "lower side" may refer to the opposite direction (e.g., the negative z-axis direction) indicated by the arrow of the z-axis.

The display device 10 may have a rectangular shape when viewed from the top. For example, the display device 10 may have a rectangular shape having shorter sides in a first direction (e.g., x-axis direction) and longer sides in a second direction (e.g., y-axis direction) when viewed from the top as shown in FIGS. 1 and 2. Each of the corners where the short side in the first direction (e.g., x-axis direction) meets the longer side in the second direction (e.g., y-axis direction) may be rounded with a predetermined curvature or may be a right angle. The shape of the display device 10 when viewed from the top is not limited to a rectangular shape, but may be formed in, for example, another polygonal shape, circular shape, or elliptical shape.

The display device 10 may include a first area DR1 which is formed flat, and a second area DR2 extended from the right and left sides of the first area DR1. The second area DR2 may be formed flat or may be curved. When the second area DR2 is formed flat, the angle formed by the first area DR1 and the second area DR2 may be an obtuse angle. When the second area DR2 is formed as a curved surface, it may have a constant curvature or a varying curvature.

Although the second areas DR2 are extended from the left and right sides of the first area DR1 in FIG. 1, this is merely illustrative. For example, the second area DR2 may extend from only one of the right and left sides of the first area DR1. In addition, the second area DR2 may extend from at least one of upper and lower sides, connecting to the right and left sides, of the first area DR1, as well as the left side and right side. In the following description, the second areas DR2 are disposed at the left and right edges of the display device 10, respectively.

Figure 6:
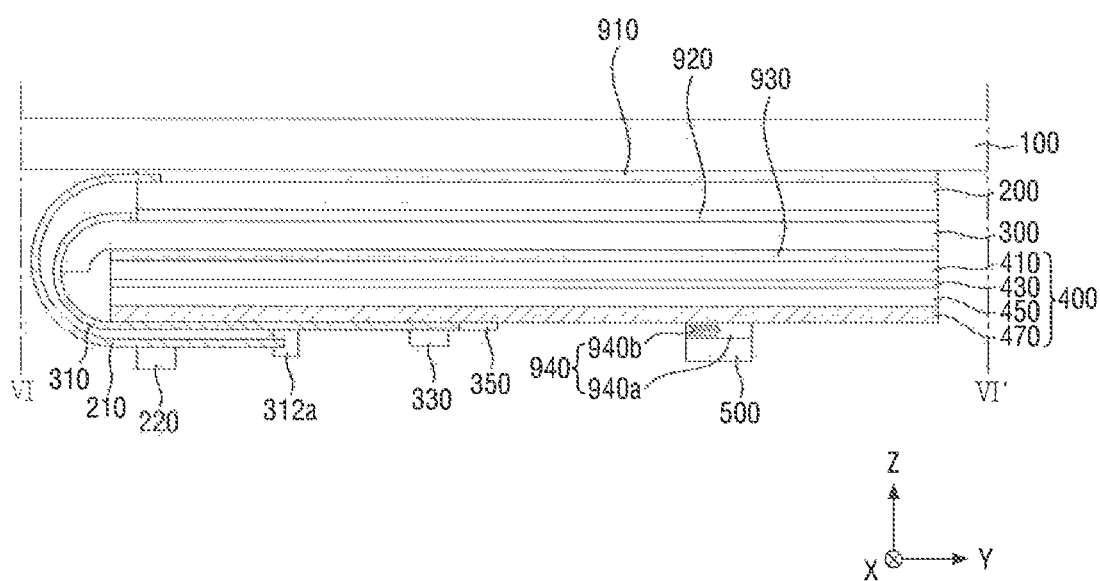
FIG. 6 is a cross-sectional view taken along line VI-VI' of FIG. 1 according to an exemplary embodiment of the present invention.

The cover window 100 may be disposed on the display panel 300 to cover the upper surface of the display panel 300. Thus, the cover window 100 can protect the upper surface of the display panel 300. The cover window 100 may be attached to the touch sensing device 200 through a first adhesive member 910 as shown in FIG. 6. For example, the first adhesive member 910 may be an optically cleared adhesive film (OCA) or an optically cleared resin (OCR).

The cover window 100 may include a transmissive portion DA100 corresponding to the display panel 300 and a non-transmissive portion NDA100 corresponding to an area other than the display panel 300. For example, the non-transmissive portion NDA100 may at least partially surround the transmissive portion DA100. The cover window 100 may be disposed in the first area DR1 and the second areas DR2. The transmissive portion DA100 may be disposed in a part of the first area DR1 and a part of each of the second areas DR2. The non-transmissive portion NDA 100 may be opaque. In addition, the non-transmissive portion NDA 100 may be formed as a decoration layer having a pattern that can be displayed to the user when no image is displayed. For example, the company's logo such as "SAMSUNG" or various letters may be patterned in the non-transmissive portion NDA100. Holes HH for exposing a front camera, a front speaker, an infrared sensor, an iris recognition sensor, a luminance sensor, etc. may be formed in the non-transmissive portion NDA100. For example, some or all of the front camera, the front speaker, the infrared sensor, an iris recognition sensor and the luminance sensor may be incorporated into the display panel 300, in which case some or all of the holes HH may be removed.

The cover window 100 may be made of, for example, glass, sapphire, and/or plastic. The cover window 100 may be rigid or flexible.

The touch sensing device 200 may be disposed between the cover window 100 and the display panel 300. The touch sensing device 200 may be disposed in the first area DR1 and the second areas DR2. Therefore, a user's touch can be sensed not only in the first area DR1 but also in the second areas DR2.

The touch sensing device 200 may be attached to the lower surface of the cover window 100 through the first adhesive member 910 as shown in FIG. 6. A polarizing film may be added on the touch sensing device 200 to prevent the visibility from decreasing due to reflection of external light. The polarizing film may be attached to the lower surface of the cover window 100 through the first adhesive member 910.

The touch sensing device 200 is an element for sensing a user's touch position. For example, the touch sensing device 200 may be implemented as a capacitive touch sensing device of a self capacitance type or a mutual capacitance type. When the touch sensing device 200 is of a self-capacitance type, the touch sensing device 200 may include only the touch driving electrodes. In addition, when the touch sensing device 200 is of a mutual capacitance type, the touch sensing device 200 may include touch driving electrodes and touch sensing electrodes. In the following description, the mutual capacitive touch sensing device will be described as an example.

The touch sensing device 200 may be in the form of panel or film. The touch sensing device 200 may be attached to a thin encapsulation layer of the display panel 300 through the second adhesive member 920 as shown in FIG. 6. For example, the second adhesive member 920 may be an optically clear adhesive film (OCA) or an optically clear resin (OCR).

In addition, the touch sensing device 200 may be formed integrally with the display panel 300. In such case, the touch driving electrodes and the touch sensing electrodes of the touch sensing device 200 may be formed on the thin-film encapsulation layer of the display panel 300 or on an encapsulation substrate or an encapsulation film covering a light-emitting element layer of the display panel 300.

Figure 3:
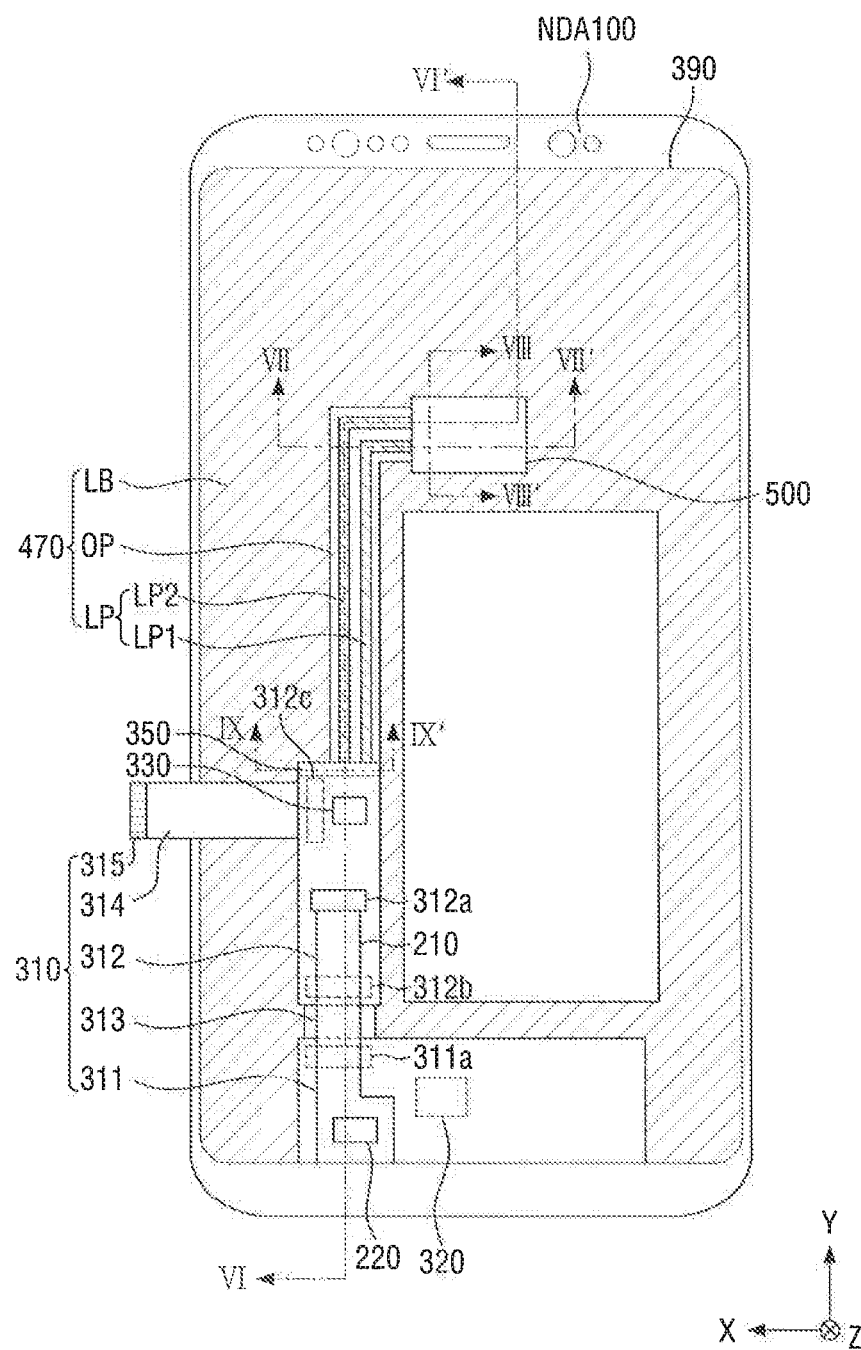
FIG. 3 is a lower view the cover window, the touch circuit board, the display panel, the display circuit board, the panel lower member, and the sound generator of FIG. 2 according to an exemplary embodiment of the present invention.

A touch circuit board 210 may be attached to one side of the touch sensing device 200. For example, one end of the touch circuit board 210 may be attached to pads disposed on one side of the touch sensing device 200 using an anisotropic conductive film. In addition, a touch connection portion may be disposed on the other end of the touch circuit board 210. The touch connection portion may be connected to a touch connector of the display circuit board 310 as shown in FIG. 3. The touch circuit board may be a flexible printed circuit board.

The touch driver 220 may apply touch driving signals to the touch driving electrodes of the touch sensing device 200, may sense sensing signals from the touch sensing electrodes of the touch sensing device 200, and may calculate a user's touch position by analyzing the sensing signals. The touch driver 220 may be formed as an integrated circuit and mounted on the touch circuit board 210.

The display panel 300 may be disposed under the touch sensing device 200. The display panel 300 may overlap the transmissive portion 100DA of the cover window 100. The display panel 300 may be disposed in the first area DR1 and the second areas DR2. Therefore, the image on the display panel 300 can be seen not only in the first area DR1 but also in the second areas DR2.

The display panel 300 may be a light-emitting display panel including a light-emitting element. For example, the display panel 300 may include an organic light-emitting display panel using organic light-emitting diodes, a micro light-emitting diode display panel using micro Leeds, and/or a quantum-dot light-emitting display panel including quantum-dot light-emitting diodes.

For example, the display panel 300 may include a substrate, a thin-film transistor layer disposed on the substrate, a light-emitting element layer, and a thin-film encapsulation layer.

Since the display panel 300 is flexible, it can be formed of plastic. The substrate may include a flexible substrate and a support substrate. Because the support substrate supports the flexible substrate, it may be less flexible than the flexible substrate. Each of the flexible substrate and the support substrate may include a flexible polymer material. For example, each of the flexible substrate and the support substrate may be polyethersulphone (PES), polyacrylate (PA), polyacrylate (PAR), polyetherimide polyethylenenapthalate (PEN), polyethyleneterepthalate, (PET), polyphenylenesulfide (PPS), polyallylate, polyimide (PI), polycarbonate (PC), cellulosetriacetate (CAT), cellulose acetate propionate (CAP), or combinations thereof.

A thin film transistor layer may be disposed on the substrate. The thin film transistor layer may include scan lines, data lines, and thin film transistors. Each of the thin film transistors includes a gate electrode, a semiconductor layer, and source and drain electrodes. For example, when a scan driver is formed directly on the substrate, it may be formed together with the thin film transistor layer.

The light-emitting element layer is disposed on the thin film transistor layer. The light-emitting element layer includes anode electrodes, an emissive layer, a cathode electrode, and banks. The emissive layer may include an organic emissive layer including an organic material. For example, the emissive layer may include a hole injection layer, a hole transporting layer, an organic light-emitting layer, an electron transporting layer, and an electron injection layer. For example, the hole injection layer and the electron injection layer may be eliminated. When a voltage is applied to the anode electrode and the cathode electrode, the holes and electrons move to the organic emissive layer through the hole transporting layer and the electron transporting layer, respectively, such that they combine in the organic emissive layer to emit light. The light-emitting element layer may be a pixel array layer where pixels are formed. Accordingly, the region where the light-emitting element layer is formed may be a display area for displaying images. The peripheral area of the display area may be a non-display area.

A thin encapsulation layer may be disposed on the light-emitting element layer. The thin encapsulation layer serves to prevent permeation of oxygen or moisture into the light-emitting element layer. For example, the thin encapsulation layer may include at least one inorganic layer and at least one organic layer.

The display circuit board 310 may be attached to one side of the display panel 300. For example, one end of the display circuit board 310 may be attached to pads disposed on one side of the display panel 300 using an anisotropic conductive film. The display circuit board 310 can be bent toward the lower surface of the display panel 300. The touch circuit board 210 may also be bent toward the lower surface of the display panel 300. For example, the display circuit board 310 and the touch circuit board 210 may be bent to face the lower surface of the display panel 300. Accordingly, the touch connection portion disposed at one end of the touch circuit board 210 may be connected to the touch connector 312a of the display circuit board 310. The display circuit board 310 will be described in detail with reference to FIGS. 3 to 5.

The display driver 320 outputs signals and voltages for driving the display panel 300 through the display circuit board 310. The display driver 320 may be formed as an integrated circuit and mounted on the display circuit board 310, but the present invention is not limited thereto. For example, the display driver 320 may be directly mounted on the substrate of the display panel 300, for example, on the upper surface or the lower surface of the substrate of the display panel 300.

A cover panel member 400 may be disposed under the display panel 300 as shown in FIG. 6. The cover panel member 400 may be attached to the lower surface of the display panel 300 through a third adhesive member 930. For example, the third adhesive member 930 may be an optically clear adhesive film (OCA) or an optically clear resin (OCR).

The cover panel member 400 may include a buffer member 410 for absorbing external impact, a film layer 430, a shielding member 450 for blocking electromagnetic waves, and a heat-dissipating member 470 for efficiently dissipating heat. It is, however, to be understood that the present invention is not limited thereto. The cover panel member 400 may further include a light-blocking layer and a light-absorbing member for blocking light incident from the outside. The light-absorbing member may be disposed under the display panel 300. The light-absorbing member may block the transmission of light to prevent the elements disposed under the light-absorbing member, e.g., the sound generator 500 and the display circuit board 310 from being seen from above the display panel 300. For example, the light-absorbing member may include a light-absorbing material such as a black pigment and a dye.

The buffer member 410 may be disposed under the light-absorbing member. The buffer member 410 may absorb an external impact to prevent the display panel 300 from being damaged. In addition, the buffer member 410 may be made up of a single layer or multiple layers. For example, the buffer member 410 may be formed of a polymer resin such as polyurethane, polycarbonate, polypropylene and/or polyethylene, and/or may be formed of a material having elasticity such as a rubber and a sponge obtained by foaming a urethane-based material and/or an acrylic-based material. For example, the buffer member 410 may be a cushion layer.

The film layer 430 may be disposed on the buffer member 410. For example, the film layer 430 may be disposed under the film layer 430. The film layer 430 may be implemented as a flexible thin film. For example, the film layer 430 may be polyallylate, polyimide (PI), polycarbonate (PC), cellulosetriacetate (CAT), cellulose acetate propionate (CAP) or a combination thereof.

The shielding member 450 may be disposed on the film layer 430. For example, the shielding member 450 may be disposed under the film layer 430. For example, the shielding member 450 may include graphite and/or carbon nanotube to block electromagnetic waves.

The heat-dissipating member 470 may be disposed on the shielding member 450. For example, the heat-dissipating member 470 may be disposed under the shielding member 450. For example, the heat-dissipating member 470 may be made of a thin metal film such as copper (Cu) that is excellent in thermal conductivity. It is, however, to be understood that the present invention is not limited thereto. For example, the heat-dissipating member 470 may be made of a metal having electrical conductivity.

The sound generator 500 may be disposed under the cover panel member 400. The sound generator 500 may be attached to the bottom surface of the cover panel member 400 through a fourth adhesive member 940. The fourth adhesive member 940 may be an anisotropic conductive film (ACF) including a binder 940a and conductive particles 940b.

An anisotropic conductive film (ACF) may refer to a film in which metal particles such as nickel (Ni) and gold (Au), or conductive particles 940b such as polymer particles coated with such metal are dispersed in the binder 940a. An anisotropic conductive film is electrically conductive in the thickness direction (e.g., z-axis direction) while electrically insulative in the longitudinal direction (e.g., x-axis direction and y-axis direction). By disposing the fourth adhesive member 940 made of the anisotropic conductive film as described above, it is possible to apply the driving voltage to the sound generator 500 using the heat-dissipating member 470. More detailed description thereon will be made later.

For example, the sound generator 500 may include a piezo actuator. In such case, the sound generator 500 can vibrate by applying an alternating voltage to compress and expand the piezo actuator. As the sound generator 500 vibrates, the display panel 300 may vibrate vertically, thereby outputting sound.

The sound generator 500 may be connected to the display circuit board 310. For example, one end of the sound generator 500 may be connected to the pad unit 350 of the display circuit board 310 through lines LP included in the heat-dissipating member 470, which may be thin metal films. Accordingly, the sound generator 500 can be connected to a sound driver 330 of the display circuit board 310 without a sound circuit board.

The sound driver 330 receives sound data from the main processor 710. The sound driver 330 may generate a first driving voltage and a second driving voltage according to the sound data and may supply the first driving voltage and the second driving voltage to the sound generator 500 through the lines LP formed in the heat-dissipating member 470. In addition, the first driving voltage and the second driving voltage may be AC voltages. Accordingly, the sound generator 500 can vibrate and output sound. The sound driver 330 may include a digital signal processor (DSP) for processing sound data in the form of a digital signal, a digital-analog converter (DAC) for converting the digital signal processed in the digital signal processor into an analog signal, an amplifier (AMP) for amplifying and outputting the analog signal converted by the digital-to-analog converter, etc.

The middle frame 600 may be disposed below the cover panel member 400. For example, the middle frame 600 may include a synthetic resin, a metal, or both a synthetic resin and a metal.

In the middle frame 600, a first camera hole CMH1 for inserting a camera device 720, a battery hole BH for dissipating the heat from a battery, and a through hole CAH through which a second connection cable 314 connected to the display circuit board 310 passes. In the middle frame 600, an accommodating hole AH for accommodating the sound generator 500 may be formed. The width of the accommodating hole may be larger than the width of the sound generator 500. The accommodating hole AH may be formed integrally with the battery hole BH. However, the present invention is not limited thereto. For example, the accommodating hole AH and battery hole BH may be formed separately.

The sound generator 500 may be connected to the heat-dissipating member 470 of the cover panel member 400 to suppress the influence on the display panel 300 by the heat generated from the sound generator 500. In addition, when the sound generator 500 is overlapped with the battery hole BH where the battery is disposed, the heat from the battery may hinder the dissipation of the heat from the sound generator 500. Therefore, the sound generator 500 may not overlap with the battery hole BH.

A waterproof member 610 may be disposed along the outer line of the middle frame 600. For example, the waterproof member 610 may be disposed along the outer sides or boundary of the middle frame 600. The waterproof member 610 is attached to the cover panel member 400. For example, the waterproof member 610 may be attached to the top surface of the cover panel member 400. It can prevent moisture and dust from permeating between the display panel 300 and the middle frame 600. For example, the display device 10 with waterproof and dustproof capabilities can be produced.

For example, the waterproof member 610 may include a base film, a first adhesive layer disposed on a surface of the base film, and a second adhesive layer disposed on the other surface of the base film. For example, the base film may be a polyethylene terephthalate (PET), a polyethyleneterephthalate (PET) and/or a cushion layer, or a polyethylene foam (PE-foam). The first adhesive film and the second adhesive film may be pressure sensitive adhesive (PSA). The first adhesive film may be adhered to the bottom surface of the cover panel member 400, and the second adhesive film may be adhered to the upper surface of the middle frame 600.

The main circuit board 700 may be disposed under the middle frame 600. The main circuit board 700 may be either a printed circuit board or a flexible printed circuit board.

The main circuit board 700 may include a main processor 710, a camera device 720, and a main connector 730. The main processor 710 and the main connector 730 may be disposed on the lower surface of the main circuit board 700 facing the bottom cover 900. In addition, the camera device 720 may be disposed on both upper and lower surfaces of the main circuit board 700. However, the present invention is not limited thereto. For example, the camera device 720 may be disposed on either the upper surface or the lower surface of the main circuit board 700.

The main processor 710 may control all the functions of the display device 10. For example, the main processor 710 may output image data to the display driver 320 of the display circuit board 310 so that the display panel 300 displays an image. In addition, the main processor 710 may receive touch data from the touch driver 22.0 to determine the position of the user's touch, and then may execute an application indicated by the icon displayed at the position of the user's touch. In addition, the main processor 710 may receive touch data from the touch driver 220 and may execute an application indicated by the icon displayed at the position of the user's touch.

In addition, in a sound output mode, the main processor 710 may output the sound data to the sound driver 330 to output sound by vibrating the display panel 300 using the sound generator 500.

For example, the main processor 710 may be an application processor, a central processing unit, or a system chip implemented as an integrated circuit.

The camera device 720 processes image frames such as a still image and a video obtained by the image sensor in the camera mode and outputs them to the main processor 710.

The second connection cable 314 passing through the through hole CAH of the middle frame 600 may be connected to the main connector 730 of the main circuit board 700. Accordingly, the main circuit board 700 may be electrically connected to the display circuit board 310 and the touch circuit board 210.

In addition to a mobile communications module capable of transmitting/receiving a radio signal to/from at least one of a base station, an external terminal and a server over a mobile communications network may be mounted on the main circuit board 700. The wireless signal may include various types of data depending on a voice signal, a video call signal, or a text/multimedia message transmission/reception.

The bottom cover 900 may be disposed below the middle frame 600 and the main circuit board 700. The bottom cover 900 may be fastened and fixed to the middle frame 600. The bottom cover 900 may form the exterior of the lower surface of the display device 10. For example, the bottom cover 900 may include plastic and/or metal.

A second camera hole CMH2 may be formed in the bottom cover 900 via which the camera device 720 is inserted to be exposed to the outside. For example, the camera device 720 may protrude beyond the lower surface of the display device 10, or the lower surface of the display device 10 and the camera device 720 may be coplanar. The positions of the camera device 720 and the first and second camera holes CMH1 and CMH2 in line with the camera device 720 are not limited to those of the exemplary embodiment shown in FIG. 2.

According to an exemplary embodiment of the present invention shown in FIGS. 1 and 2, it is possible to provide sound by using the sound generator 500 disposed under the display panel 300. In addition, the sound generator 500 can be connected to the display circuit board 310 through the lines LP formed in the heat-dissipating member 470 without a sound circuit board, so that a manufacturing process can become simplified and the cost can be reduced. Further, since the sound circuit board is eliminated, the degree of design freedom of the display device 10 can be increased.

Figure 4:
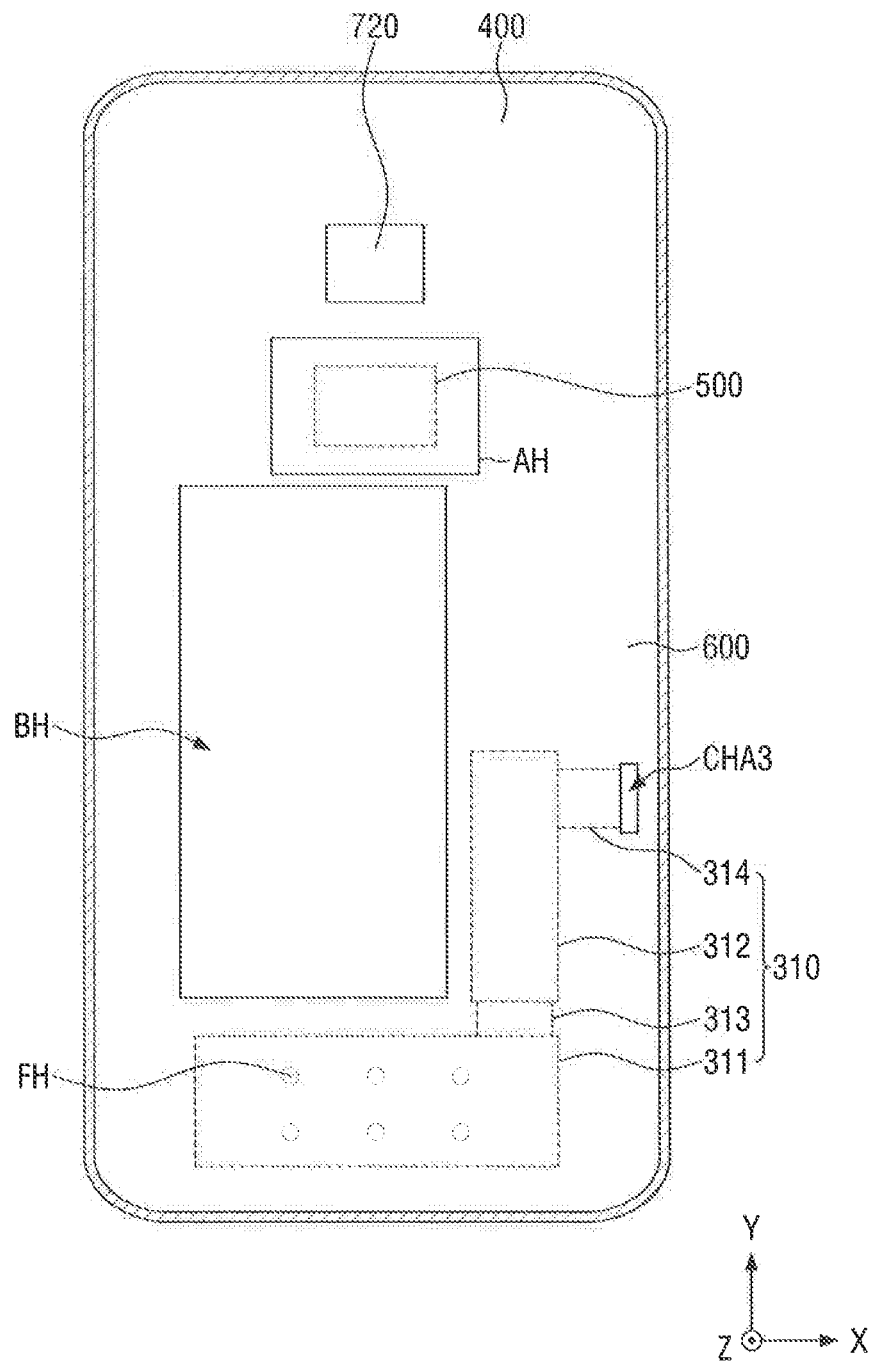
FIG. 4 is a plan view of the display circuit board, the second connection cable, the sound generator and the middle frame of FIG. 2 according to an exemplary embodiment of the present invention.
Figure 5:
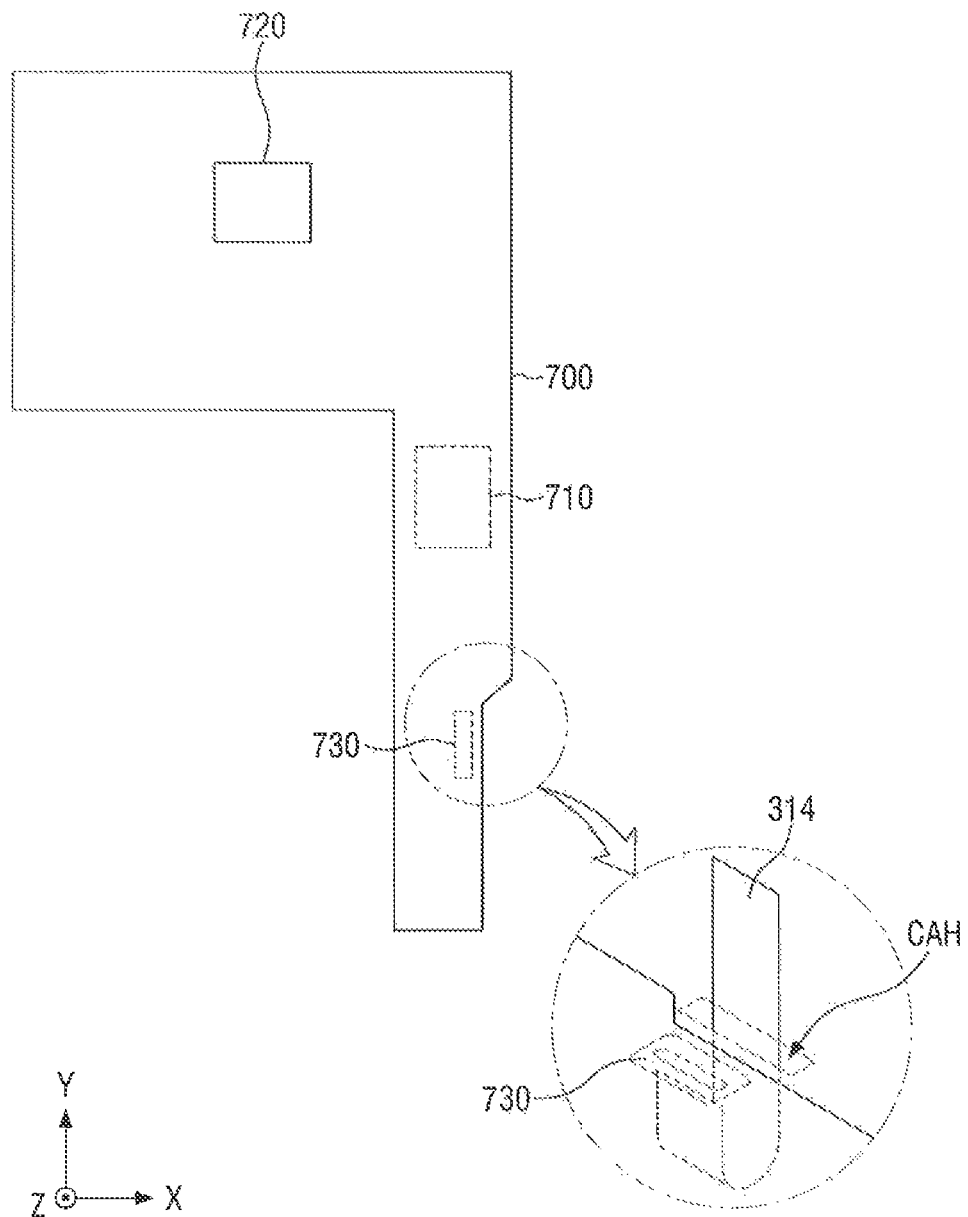
FIG. 5 is a plan view of the second connection cable and the main circuit board of FIG. 2 according to an exemplary embodiment of the present invention.

FIG. 3 is a lower view of the cover window, the touch circuit board, the display panel, the display circuit board, the cover panel member, and the sound generator of FIG. 2 according to an exemplary embodiment of the present invention. FIG. 4 is a plan view of the display circuit board, the second connection cable, the sound generator and the middle frame of FIG. 2 according to an exemplary embodiment of the present invention. FIG. 5 is a plan view of the second connection cable and the main circuit board of FIG. 2 according to an exemplary embodiment of the present invention.

In the following description, a way of connecting the sound generator 500 to the display circuit board 310, and a way of connecting the second connection cable 314 connected to the display circuit board 310 to the main connector 730 of the main circuit board 700 will be described in detail with reference to FIGS. 3 to 5.

Referring to FIGS. 3 to 5, a first line LP1 and a second line LP2 may be disposed in the cover panel member 400. For example, the heat-dissipating member 470 made of a thin metal film in the cover panel member 400 may include a base portion LB, openings OP, and lines LP. The lines LP may include, but is not limited to, a first line LP1 and a second line LP2. In an exemplary embodiment of the present invention, a single line may be disposed or three or more lines may be disposed in the cover panel member 400.

The heat-dissipating member 470 includes openings OP, and the lines LP are patterned by the openings OP. For example, the openings OP separate the base portion LB from the lines LP, and the lines LP are formed in the openings OP. In addition, a shape of the lines LP correspond to a shape of the openings OP. For example, each of the openings OP may be formed between the base portion LB and the first line LP1, between the first line LP1 and the second line LP2, and between the second line LP2 and the base portion LB. Each of the first line LP1 and the second line LP2 may be spaced apart from the base portion LB and from each other. Accordingly, the first line LP1, the second line LP2, and the base portion LB are not electrically connected to one another and may have different voltages. For example, the first line LP1, the second line LP2 and the base portion LB may insulated from each other. For example, a first driving voltage may be applied to the first line LP1, a second driving voltage may be applied to the second line LP2, and a ground voltage may be applied to the base portion LB. However, the present invention is not limited thereto.

Although the first line LP1, the second line LP2 and the openings OP are extended in the y-axis direction and are bent in the x-axis direction in the example shown in FIG. 3, this is merely illustrative. The first line LP1, the second line LP2 and the openings OP may have a variety of shapes as long as they can electrically connect the display circuit board 310 with the sound generator 500. For example, the first line LP1, the second line LP2 and the openings OP may have an L-shape.

The display circuit board 310 may include a first circuit board 311, a second circuit board 312 and a first connection cable 313.

The first circuit board 311 may be attached to one side of the upper surface or the lower surface of the substrate of the display panel 300 and may be bent toward the lower surface of the substrate of the display panel 300. For example, the first circuit board 311 may be bent to face the lower surface of the substrate of the display panel 300. The first circuit board 311 may be fixed in the fixing holes FH formed in the middle frame 600 by fixing members as shown in FIG. 4.

The first circuit board 311 may include a display driver 320 and a first connector 311a. The display driver 320 and the first connector 311a may be disposed on one surface of the first circuit board 311.

The first connector 311a may be connected to one end of the first connection cable 313 connected to the second circuit board 312. In this manner, the display driver 320 mounted on the first circuit board 311 can be electrically connected to the second circuit board 312 through the first connection cable 313.

The second circuit board 312 may include a touch connector 312a, a first connection connector 312b, a second connection connector 312c, a sound driver 330, and a pad unit 350. The first connection connector 312b and the second connection connector 312c may be disposed on one surface of the second circuit board 312, and the touch connector 312a may be disposed on the other surface of the second circuit board 312. However, the present invention is not limited thereto. For example, the first connection connector 312b, the second connection connector 312c and touch connector 312a may be disposed on the same surface of the second circuit board 312.

The touch connector 312a may be connected to a touch connection portion disposed on one end of the touch circuit board 210. Accordingly, the touch driver 220, which is electrically connected to the touch circuit board 210, may be electrically connected to the second circuit board 312.

The first connection connector 312b may be connected to the end of the first connection cable 313 that is opposite to the end of the first connection cable 313 connected to the first circuit board 311. In this manner, the display driver 320 mounted on the first circuit board 311 can be electrically connected to the second circuit board 312 through the first connection cable 313.

The second connection connector 312c may be connected to one end of the second connection cable 314 connected to the main connector 730 of the main circuit board 700. Thus, the second circuit board 312 may be electrically connected to the main circuit board 700 through the second connection cable 314.

A connector connection portion 315 may be formed at the other end of the second connection cable 314. The connector connection portion 315 of the second connection cable 314 may be extended below the middle frame 600 through the through hole CAH of the middle frame 600 as shown in FIG. 4. In addition, as shown in FIG. 5, the connector connection portion 315 of the second connection cable 314 which has passed through the through hole CAH is led out passed the main circuit board 700 and may be extended below the main circuit board 700. For example, the main circuit board 700 may include a side that has an indentation that the second connection cable 314 may pass. Ultimately, the connector connection portion 315 of the second connection cable 314 may be connected to the main connector 730 disposed on the lower surface of the main circuit board 700 as shown in FIG. 5.

The pad unit 350 may include a plurality of pads connected to the base portion LB, the first line LP1, and the second line LP2. Some of the plurality of pads of the pad unit 350 may transmit the first driving voltage and the second driving voltage received from the sound driver 330 to the first line LP1 and the second line LP2, respectively. In addition, the other of the plurality of pads may be grounded to the base portion LB to discharge static electricity and electromagnetic waves generated from the touch circuit board 210 and the display circuit board 310 through the base portion LB.

According to the exemplary embodiment of the present invention shown in FIGS. 3 to 5, the sound generator 500 may be electrically connected to the first line LP1 and the second line LP2, and the first line LP1 and the second line LP2 may be electrically connected to the pad unit 350 of the display circuit board 310. Therefore, the sound generator 500 and the sound driver 330 of the display circuit board 310 can be connected to each other.

In addition, according to the exemplary embodiment of the present invention shown in FIGS. 3 to 5, the second connection cable 314 connected to the second circuit board 312 may be extended below the middle frame 600 through the through hole CAH of the middle frame 600 to be connected to the main connector 730 of the main circuit board 700. Therefore, the display circuit board 310 can be connected to the main circuit board 700.

Figure 7:
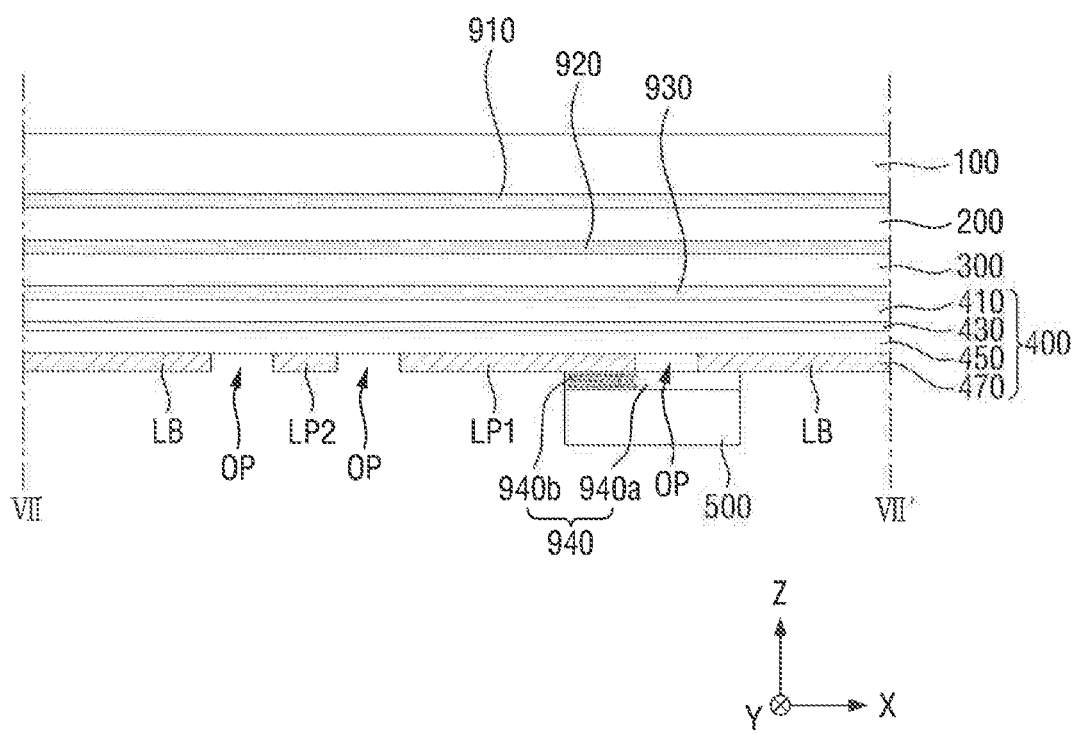
FIG. 7 is a cross-sectional view taken along line VII-VII' of FIG. 3 according to an exemplary embodiment of the present invention.
Figure 8:
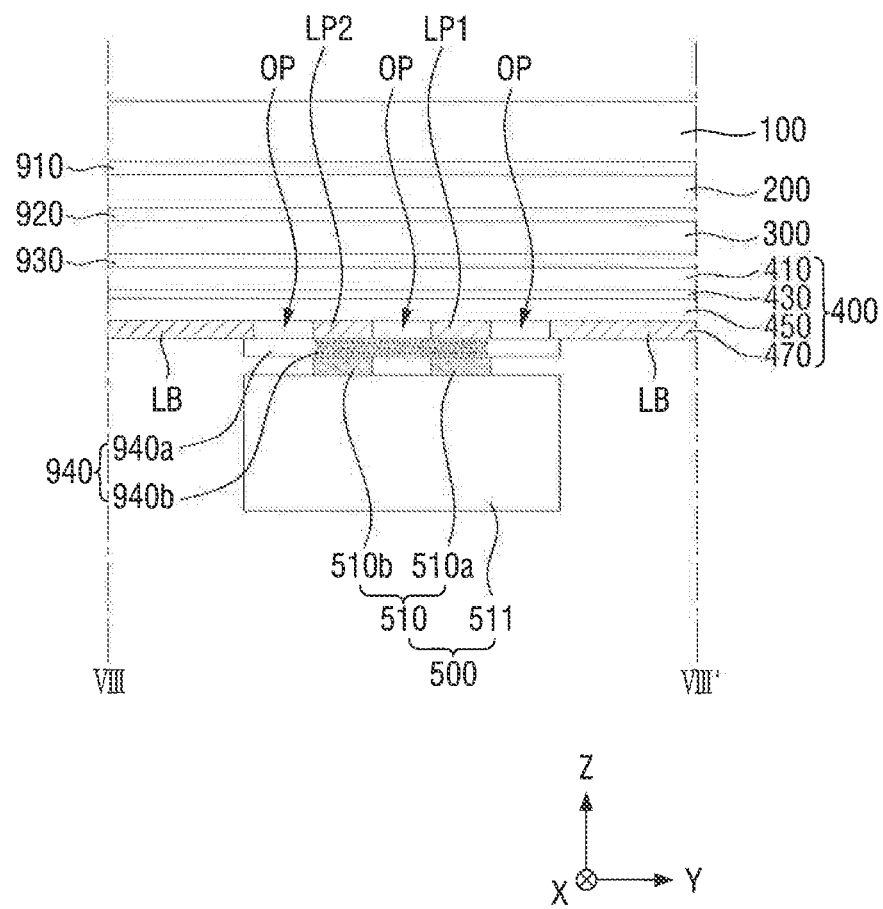
FIG. 8 is a cross-sectional view taken along line VIII-VIII' of FIG. 3 according to an exemplary embodiment of the present invention.
Figure 9:
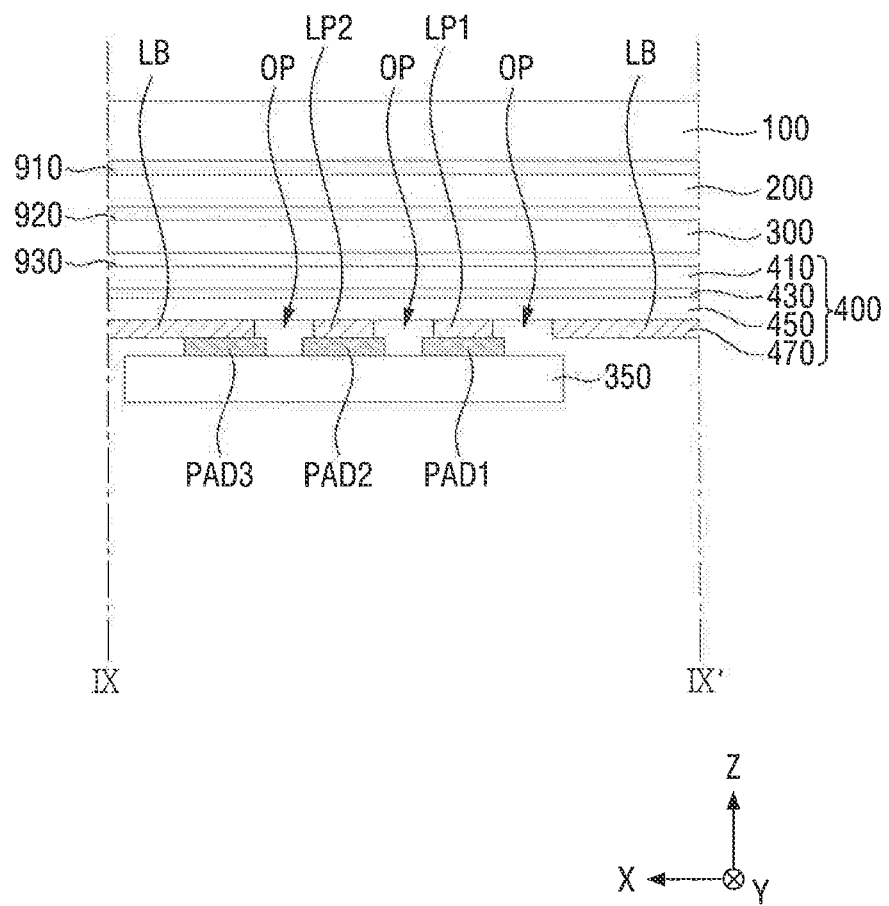
FIG. 9 is a cross-sectional view taken along line IX-IX' of FIG. 3 according to an exemplary embodiment of the present invention.

FIG. 6 is a cross-sectional view taken along line VI-VI' of FIG. 1 according to an exemplary embodiment of the present invention. FIG. 7 is a cross-sectional view taken along line VII-VII' of FIG. 3 according to an exemplary embodiment of the present invention. FIG. 8 is a cross-sectional view taken along line VIII-VIII' of FIG. 3 according to an exemplary embodiment of the present invention. FIG. 9 is a cross-sectional view taken along line IX-IX' of FIG. 3 according to an exemplary embodiment of the present invention.

It should be noted that FIGS. 6 through 9 are the cross-sectional views of FIG. 3 in which the cover window 100 is shown at the top.

The cover window 100, the touch sensing device 200, the display panel 300, the cover panel member 400, the first adhesive member 910, the second adhesive member 920 and the third adhesive member 930 shown in FIGS. 6 to 9 are substantially identical to those describe above with reference to FIGS. 1 and 2; therefore, the redundant description may be omitted.

Referring to FIG. 6, the sound generator 500 is disposed under the cover panel member 400. The sound generator 500 may be attached to the bottom surface of the cover panel member 400 through a fourth adhesive member 940. For example, the fourth adhesive member 940 may be an anisotropic conductive film (ACF) including a binder 940a and conductive particles 940b. The conductive particles 940b may be disposed in at least a part of the area. For example, the conductive particles 940b may be disposed only in the areas in contact with the first line and the second line.

Each of the touch circuit board 210 and the display circuit board 310 may be respectively attached to one side of the upper surface of the touch sensing device 200 and one side of the upper surface the display panel 300, and each of the touch circuit board 210 and the display circuit board 310 may bent toward the lower surface of the display panel 300. For example, the touch circuit board 210 may be fastened and fixed to the touch connector 312a of the display circuit board 310, and the touch circuit board 210 and the display circuit board 310 may be bent and disposed on the lower surface of the heat-dissipating member 470. In addition, the pad unit 350 of the display circuit board 310 may be in contact with the heat-dissipating member 470.

Referring to FIG. 7, the heat-dissipating member 470 may include a base portion LB, openings OP, a first line LP1, and a second line LP2.

The opening OP is formed between the base portion LB and the second line LP2 to prevent an electrical connection between the base portion LB and the second line LP2. In addition, the opening OP is formed between the second line LP2 and the first line LP1 to prevent an electrical connection between the second line LP2 and the first line LP1. In addition, the opening OP is formed between the first line LP1 and the base portion LB to prevent an electrical connection between the first line LP1 and the base portion LB. As such, the heat-dissipating member 470 is partitioned into the first line LP1, the second line LP2 and the base portion LB by the openings OP, and the first line LP1, the second line LP2 and the base portion LB are spaced apart from each other and are not electrically connected to one another.

The sound generator device 500 is attached to and secured to the heat-dissipating member 470 via the fourth adhesive member 940. The fourth adhesive member 940 is in contact with a part of the first line LP1 and a part of the base portion LB. The conductive particles 940b are disposed in a portion of the fourth adhesive member 940 that is in contact with the first line LP1 to transmit the first driving voltage applied through the first line LP1 to the sound generator 500. In addition, the conductive particles 940b are not disposed in the portion of the fourth adhesive member 940 that is in contact with the base portion LB, and thus, the fourth adhesive member 940 and the base portion LB can be insulated.

In this manner, even if different voltages are applied to the first line LP1, the second line LP2 and the base portion LB of the heat-dissipating member 940, it is possible to selectively transmit the voltage to the sound generator 500 by disposing the conductive particles 640b of the fourth adhesive member 940.

For example, referring to FIG. 8, the sound generator 500 may include a vibration layer 511 and a connection portion 510. The connection portion 510 may include a first electrode 510a and a second electrode 510b. The first electrode 510a and the second electrode 510b may be in contact with the fourth adhesive member 940.

The fourth adhesive member 940 may be in contact with the base portion LB, the first line LP1 and the second line LP2 of the heat-dissipating member 470. The first electrode 510a of the sound generator 500 and the first line LP1 of the heat-dissipating member 470 may be overlapped in the thickness direction (e.g., z-axis direction). The second electrodes 510b of the sound generator 500 and the second line LP2 of the heat-dissipating member 470 may be overlapped in the thickness direction (e.g., z-axis direction).

The conductive particles 940b of the fourth adhesive member 940 may overlap with the first electrode 510a of the sound generator 500 and the first line LP1 of the heat-dissipating member 470 in the thickness direction (e.g., z-axis direction). The conductive particles 940b of the fourth adhesive member 940 may overlap with the second electrode 510b of the sound generator 500 and the second line LP2 of the heat-dissipating member 470 in the thickness direction (e.g., z-axis direction). The conductive particles 940b of the fourth adhesive member 940 may be disposed such that they overlap with the opening OP between the first line LP1 and the second line LP2 in the thickness direction (e.g., z-axis direction). It is, however, to be understood that the present invention is not limited thereto. The conductive particles 940b of the fourth adhesive member 940 may not be disposed in the opening OP between the first line LP1 and the second line LP2. In addition, the fourth adhesive member 940 may not be in contact with the base portion LB of the heat-dissipating member 470 but may be in contact with the first line LP1 and the second line LP2 of the heat-dissipating member 470.

Referring to FIG. 9, the pad unit 350 of the display circuit board 310 may include a plurality of pads. For example, the pad unit 350 may include a first pad PAD1, a second pad PAD2, and a third pad PAD3. The first pad PAD1 of the pad unit 350 may be disposed such that it overlaps with the first line LP1 of the heat dissipating member 470 in the thickness direction. (e.g., z-axis direction). The first pad PAD1 and the first line LP1 may be electrically connected to each other and may receive the first driving voltage from the sound driver 330 and may transmit the first driving voltage to the first line LP1.

The second pad PAD2 of the pad unit 350 may be disposed such that it overlaps with the second line LP2 of the heat-dissipating member 470 in the thickness direction (e.g., z-axis direction). The second pad PAD2 and the second line LP2 may be electrically connected to each other and may receive the second driving voltage from the sound driver 330 and may transmit the second driving voltage to the second line LP2.

The third pad PAD3 of the pad unit 350 may be grounded by being in contact with a part of the base portion LB of the heat-dissipating member 470. The third pad PAD3 may discharge static electricity, electromagnetic waves, etc. generated from the touch circuit board 210 and the display circuit board 310 through the base portion LB.

In an exemplary embodiment of the present invention, an anisotropic conductive film (ACF) may be disposed between the heat dissipating member 470 and each of first pad PAD1, the second pad PAD2, and the third pad PAD3.

Figure 10:
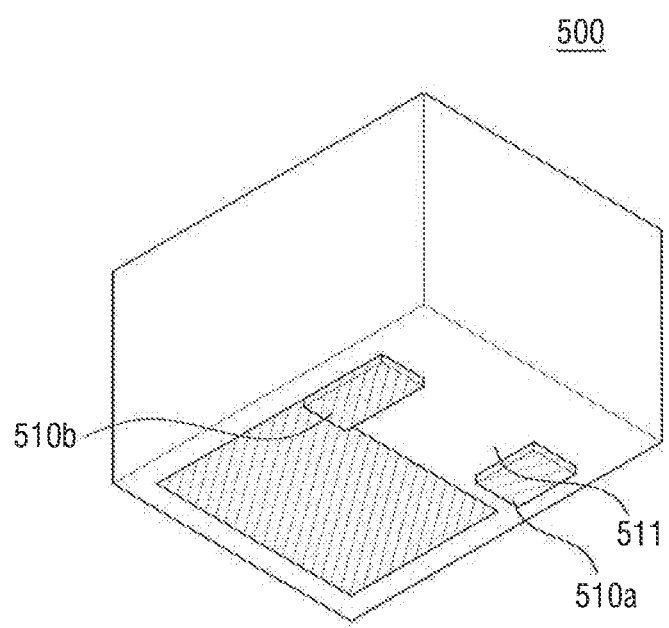
FIG. 10 is a perspective view of a sound generator according to an exemplary embodiment of the present invention.
Figure 11:
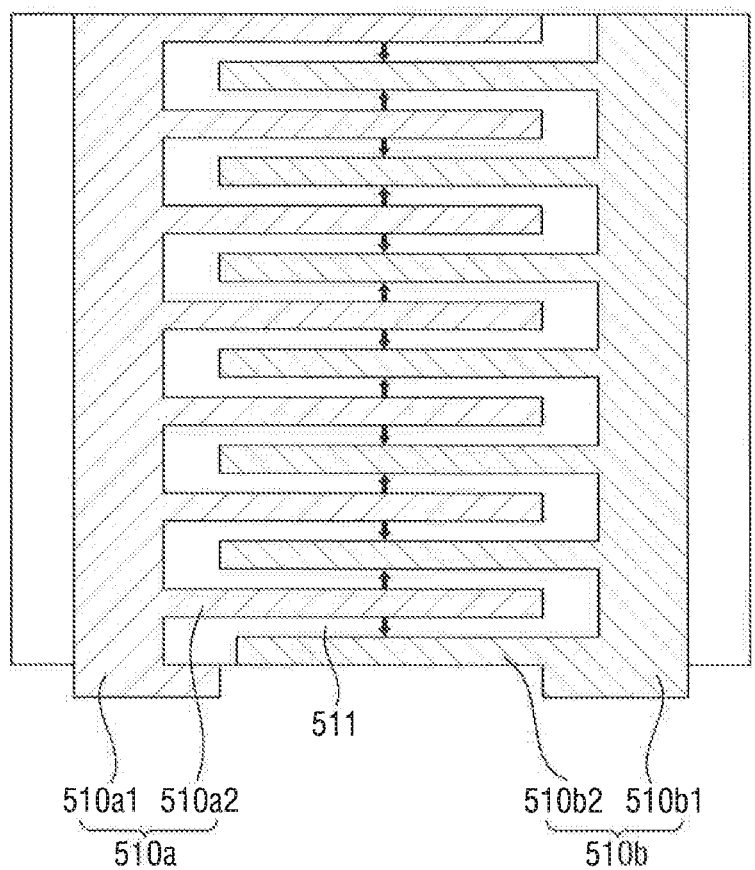
FIG. 11 is a cross-sectional view of a sound generator according to an exemplary embodiment of the present invention.

FIG. 10 is a perspective view of a sound generator according to an exemplary embodiment of the present invention. FIG. 11 is a cross-sectional view of a sound generator according to an exemplary embodiment of the present invention.

Referring to FIGS. 10 and 11, the sound generator 500 may include a vibration layer 511, a first electrode 510a, and a second electrode 510b.

The first electrode 510a may include a first stem electrode 510a1 and first branch electrodes 510a2. Although the first stem electrode 510a1 may be disposed on one side of the vibration layer 511, the present invention is not limited thereto. The first stem electrode 510a1 may be disposed on multiple sides of the vibration layer 511.

A part of the first stem electrode 510a1 may be exposed through the vibration layer 511. For example, one end of the first stem electrode 510a1 may protrude through the lower surface of the vibration layer 511, and the other end of the first stem electrode 510a1 may protrude through the upper surface of the vibration layer 511. However, the present invention is not limited thereto. For example, either the one end or the other end of the first stem electrode 510a1 may protrude beyond its respective surface of the vibration layer 511.

The first branch electrodes 510a2 may branch off from the first stem electrode 510a1. The first branch electrodes 510a2 may be arranged in a vertical direction and may be parallel to one another.

The second electrode 510b may include a second stem electrode 510b1 and second branch electrodes 510b2. The second stem electrode 510b1 may be disposed on a side opposing the side surface of the vibration layer 511 on which the first stem electrode 510a1 is disposed. It is, however, to be understood that the present invention is not limited thereto. The second stem electrode 510b1 may be disposed on the same side as the side surface of the vibration layer 511 on which the first stem electrode 510a1 is disposed. In addition, the second stem electrode 510b1 may be disposed on a plurality of side surfaces of the vibration layer 511 where the first stem electrode 510a1 is not disposed.

A part of the second stem electrode 510b1 may be exposed through the vibration layer 511. For example, one end of the second stem electrode 510b1 may protrude through the lower surface of the vibration layer 511, and the other end of the second stem electrode 510b1 may protrude through the upper surface of the vibration layer 511. However, the present invention is not limited thereto. For example, either the one end or the other end of the second stem electrode 510b1 may protrude beyond its respective surface of the vibration layer 511.

The first stem electrode 510a1 may not overlap with the second stem electrode 510b1. The second branch electrodes 510b2 may branch off (e.g., extend) from the second stem electrode 510b1. The second branch electrodes 510b2 may be arranged in a vertical direction and may be parallel to one another.

The first branch electrodes 510a2 and the second branch electrodes 510b2 may be parallel to one another and may extend in the horizontal direction (e.g., x-axis direction or y-axis direction). In addition, the first branch electrodes 510a2 and the second branch electrodes 510b2 may be alternately arranged in the vertical direction (e.g., z-axis direction). For example, in the vertical direction (e.g., z-axis direction), the first branch electrode 510a2 may be disposed, then the second branch electrode 510b2 may be disposed, then the first branch electrode 510a2 may be disposed, and so on.

Because the vibration layer 511 is produced at a high temperature, the first electrode 510a and the second electrode 510b may be made of, for example, silver (Ag) having a high melting point or an alloy of silver (Ag) and palladium (Pd). When the first electrode 510a and the second electrode 510b are made of an alloy of silver (Ag) and palladium (Pd), the content of silver (Ag) may be higher than the content of palladium (Pd).

The vibration layer 511 may be a piezo actuator that is deformed according to the first driving voltage applied to the first electrode 510a and the second driving voltage applied to the second electrode 510b. In such case, the vibration layer 511 may be one of a piezoelectric material such as a poly vinylidene fluoride (PVDF) film and a plumbum zirconate titanate (PZT) and an electroactive polymer.

The vibration layer 511 may be disposed in every space between the first branch electrodes 510a2 and the second branch electrodes 510b2. The vibration layer 511 contracts or expands according to a difference between the first driving voltage applied to the first branch electrode 510a2 and the second driving voltage applied to the second branch electrode 510b2.

For example, as shown in FIG. 9, the polarity direction of the vibration layer 511 disposed between the second branch electrode 510b2 and the first branch electrode 510a2 disposed below the second branch electrode 510b2 may be the upward direction (↑). In such case, the vibration layer 511 has a positive polarity in the upper region adjacent to the second branch electrode 510b2, and a negative polarity in the lower region adjacent to the first branch electrode 510a2. In addition, the polarity direction of the vibration layer 511 disposed between the first branch electrode 510a2 and the second branch electrode 510b2 disposed below the first branch electrode 510a2 may be the downward direction. In such case, the vibration layer 511 has the negative polarity in the upper region adjacent to the first branch electrode 510a2, and the positive polarity in the lower region adjacent to the second branch electrode 510b2. The polarity direction of the vibration layer 511 may be determined by a poling process of applying an electric field to the vibration layer 511 using the second branch electrode 510b2 and the first branch electrode 510a2.

Figure 12:
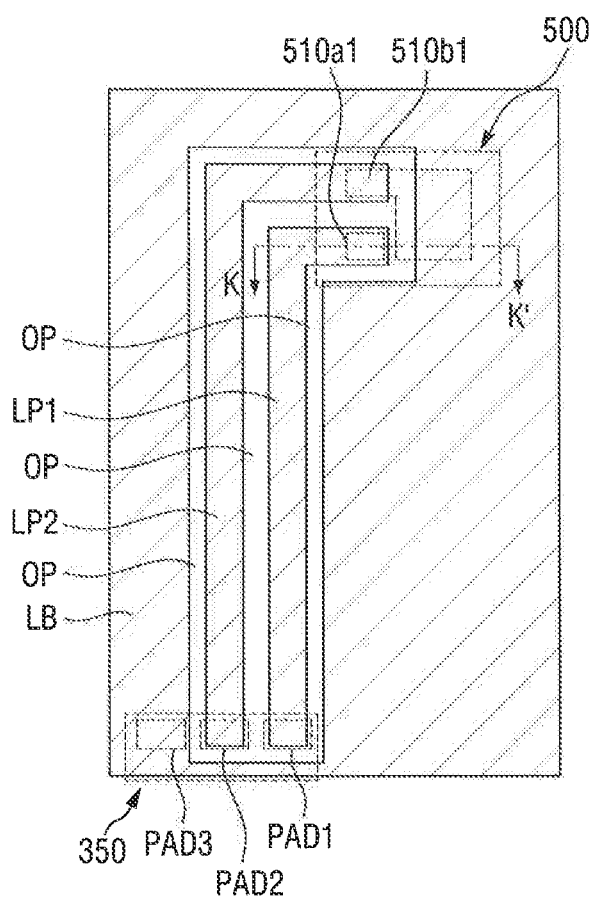
FIG. 12 is a lower view schematically showing the connection relationship between the sound generator and the display circuit board according to an exemplary embodiment of the present invention.

FIG. 12 is a lower view schematically showing the connection relationship between the sound generator and the display circuit board according to an exemplary embodiment of the present invention.

As shown in FIG. 12, the heat-dissipating member 470 includes openings OP, and the lines LP are patterned by forming the openings OP. For example, the openings OP separate the base portion LB from the lines LP, and the lines LP are formed by the openings OP. For example, an opening OP may be formed between the base portion LB and the first line LP1, between the first line LP1 and the second line LP2, and between the second line LP2 and the base portion LB. Each of the first line LP1 and the second line LP2 may be separated from each other and the base portion LB when viewed from the top.

One end of each of first line LP1 and the second line LP2 may be electrically connected to the sound generator 500. For example, the first line LP1 and the second line LP2 may overlap with the protruding first stem electrode 510a1 and second stem electrode 510b1 of the sound generator 500, respectively, in the thickness direction (e.g., z-axis direction). The first stem electrode 510a1 and the second stem electrode 510b1 may be electrically connected to the first line LP1 and the second line LP2, respectively, through the conductive particles 940b of the fourth adhesive member 940.

The other end of each of first line LP1 and the second line LP2 may be electrically connected to the display circuit board 310. For example, the first line LP1 and the second line LP2 may overlap with the first pad PAD1 and the second pad PAD2 of the display circuit board 310, respectively, in the thickness direction (e.g., z-axis direction), and the first line LP1 and the second line LP2 may be electrically connected to the first pad PAD1 and the second pad PAD2, respectively.

The first pad PAD1 receives the first driving voltage of negative polarity (or positive polarity) from the sound driver 330 and transmits the first driving voltage to the first stem electrode 510a1 of the sound generator 500 through the first line LP1. The second pad PAD2 receives the second driving voltage of positive polarity (or negative polarity) from the sound driver 330 and transmits the second driving voltage to the second stem electrode 510b1 of the sound generator 500 through the second line LP2.

The first driving voltage of negative polarity (or positive polarity) transmitted to the first stem electrode 510a1 is transmitted to the first branch electrode 510a2, and the second driving voltage of positive polarity (or negative polarity) transmitted to the second stem electrode 510b1 is transmitted to the second branch electrode 510b2.

Figure 13:
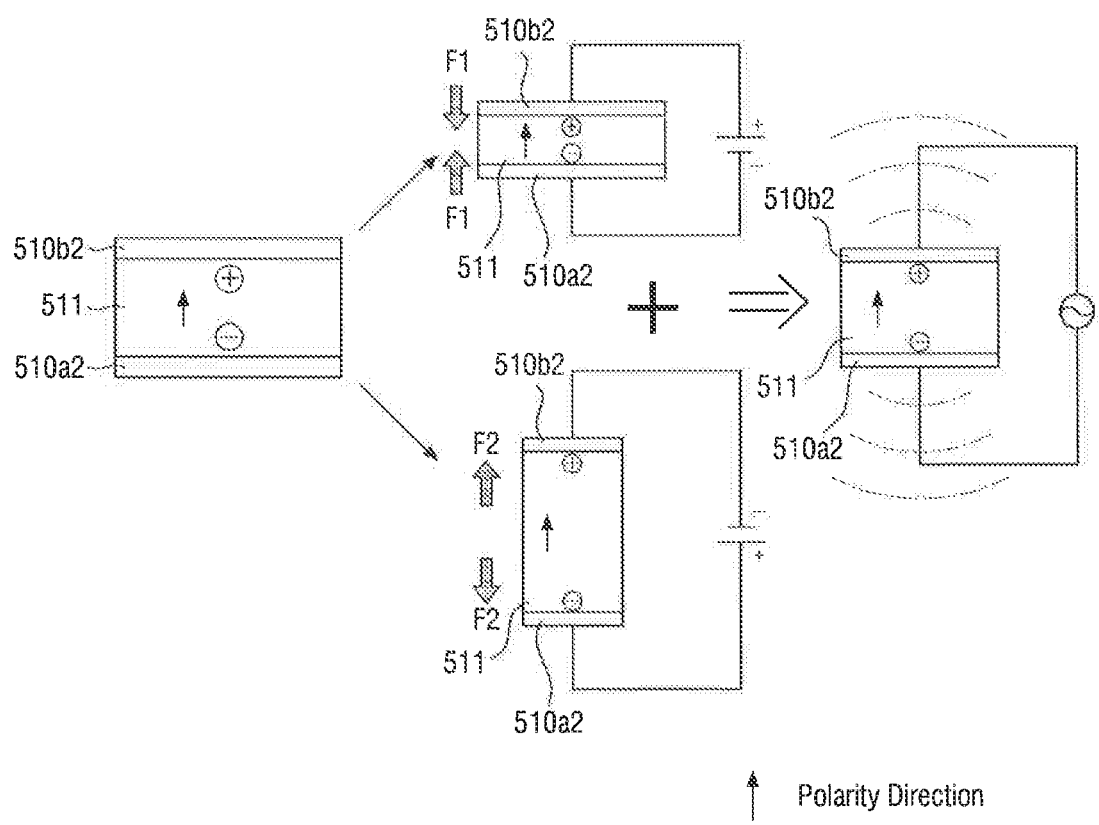
FIG. 13 is a view showing a way of vibrating a vibration layer disposed between first branch electrodes and second branch electrodes of the sound generator, according to an exemplary embodiment of the present invention.
Figure 15:
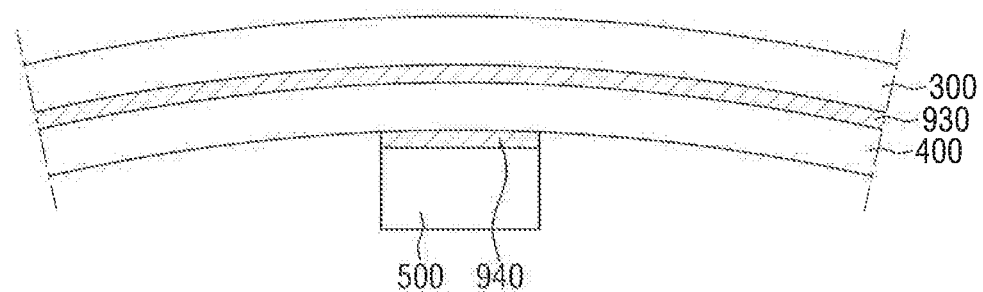

FIG. 13 is a view showing an example of a way of vibrating a vibration layer disposed between the first branch electrodes and the second branch electrodes of the sound generator, according to an exemplary embodiment of the present invention. FIGS. 14 and 15 are views showing a way of vibrating the display panel by the vibration of the sound generator, according to an exemplary embodiment of the present invention.

As shown in FIG. 13, when the polarity direction of the vibration layer 511 disposed between the first branch electrode 510a2 and the second branch electrode 510b2 above the first branch electrode 510a2 is the upward direction (↑), the first driving voltage having the negative polarity is applied to the first branch electrode 510a2 and the second driving voltage having the positive polarity is applied to the second branch electrode 510b2. Then, the vibration layer 511 can contract according to a first force F1. The first force F1 may be a contractive force. When the first driving voltage having the positive polarity is applied to the first branch electrode 510a2 and the second driving voltage having the negative polarity is applied to the second branch electrode 510b2, the vibration layer 511 may expand according to a second force F2. The second force F2 may be an expanding force.

In addition, when the polarity direction of the vibration layer 511 disposed between the second branch electrode 510b2 and the first branch electrode 510a2 above the second branch electrode 510b2 is the downward direction (↓), the first driving voltage having the positive polarity is applied to the second branch electrode 510b2 and the second driving voltage having the negative polarity is applied to the first branch electrode 510a2. Then, the vibration layer 511 can expand according to the expanding force. When the first driving voltage having the negative polarity is applied to the second branch electrode 510b2 and the second driving voltage having the positive polarity is applied to the first branch electrode 510a2, the vibration layer 511 may contract according to the contractive force. The second force F2 may be an extension force.

According to exemplary embodiment of the present invention, with reference to FIG. 11, when polarities of the first driving voltage applied to the first electrode 510a and the second driving voltage applied to the second electrode 510b repeatedly alternate between positive and negative polarities, the vibration layer 511 repeatedly contracts and expands. As a result, the sound generator 500 vibrates.

As shown in FIGS. 14 and 15, since the sound generator 500 is disposed on the lower surface of the display panel 300, as the vibration layer 511 of the sound generator 500 contracts and expands, the display panel 300 vibrates up and down by the stress from, for example, the sound generator 500. As described above, since the display panel 300 can vibrate by the sound generator 500, the display device 10 can output sound.

Figure 16:
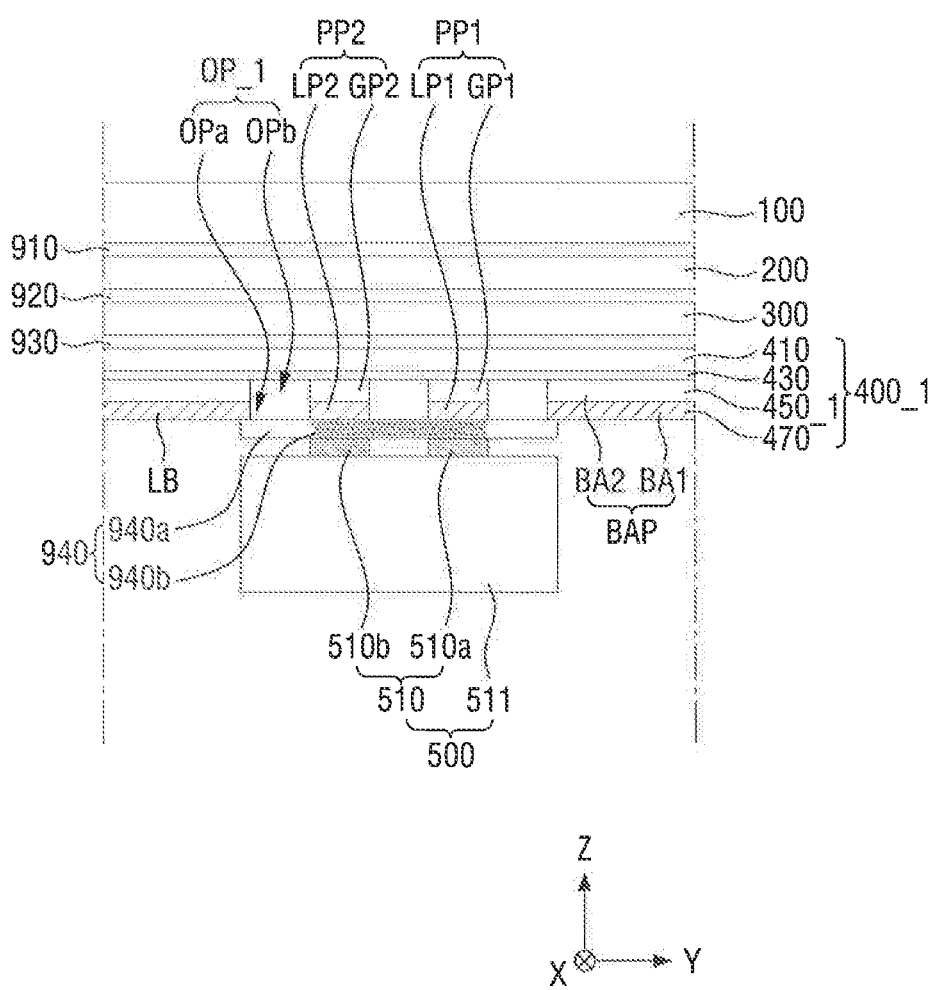
FIG. 16 is a cross-sectional view showing a connection relationship between a sound generator and a cover panel member according to an exemplary embodiment of the present invention.
Figure 17:
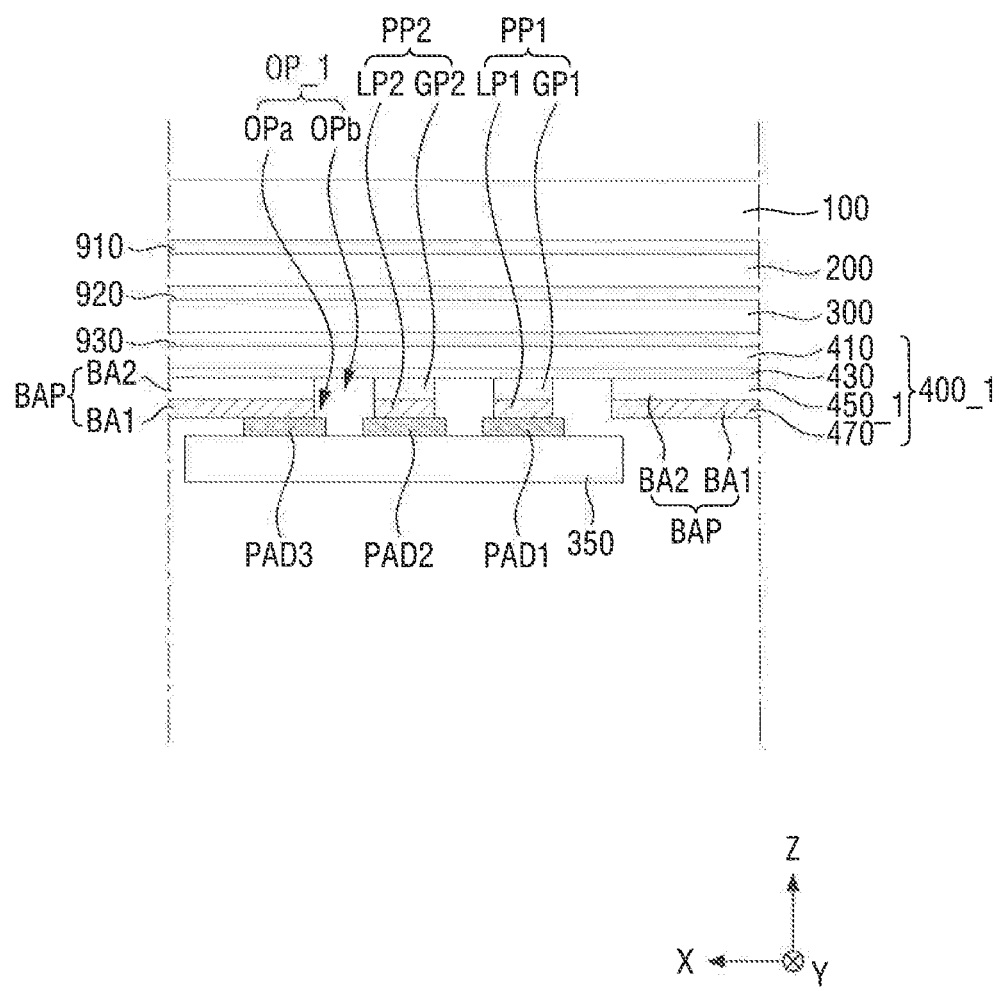
FIG. 17 is a cross-sectional view showing a connection relationship between a display circuit board and a cover panel member of a display device according to an exemplary embodiment of the present invention.

FIG. 16 is a cross-sectional view showing a connection relationship between a sound generator and a cover panel member according to an exemplary embodiment of the present invention. FIG. 17 is a cross-sectional view showing a connection relationship between a display circuit board and a cover panel member of a display device according to an exemplary embodiment of the present invention. A cover panel member 400_1 of FIGS. 16 and 17 is different from that of the exemplary embodiment shown in FIGS. 8 and 9 in that an opening OPb is further formed in a buffer member 410. Description will focus on differences, and the redundant description may be omitted.

As shown in FIGS. 16 and 17, the cover panel member 400_1 may include a buffer member 410, a film layer 430, a shielding member 450_1, and a heat-dissipating member 470. The shielding member 450_1 and the heat-dissipating member 470 may include a base BAP, an opening OP_1, and pattern portions PP1 and PP2.

The base BAP may include a first base BA1 and a second base BA2. The first base BA1 may be a part of the heat-dissipating member 470, and the second base BA2 may be a part of the shielding member 450_1. The first base BA1 and the second base BA2 may overlap each other in the thickness direction (e.g., z-axis direction). The first base BA1 and the second base BA2 may have the same area but the present invention is not limited thereto. The first base BA1 and the second base BA2 may have different areas.

The opening OP_1 may include a first opening OPa formed in the heat dissipating member 470 and a second opening OPb formed in the shielding member 450_1. The first opening OPa and the second opening OPb may overlap each other in the thickness direction (e.g., z-axis direction). The film layer 430 may be exposed by the opening OP_1. The first opening OPa and the second opening OPb may have the same width, but the present invention is not limited thereto. The first opening OPa and the second opening OPb may have different widths from each other. Although the first opening OPa and the second opening OPb are shown as having vertically straight side surfaces with respect to an upper surface of the pad unit 350, this is merely illustrative. For example, the first opening OPa and the second opening OPb may have inclined side surfaces.

The first pattern portion PP1 may include a first line LP1 disposed in the heat-dissipating member 470 and a first shielding pattern GP1 disposed in the shielding member 450_1. The first line LP1 and the first shielding pattern GP1 may overlap each other in the thickness direction (e.g., z-axis direction). The first line LP1 and the first shielding pattern GP1 may have the same width, but the present invention is not limited thereto. The first line LP1 and the first shielding pattern GP1 may have different widths. Although the first line LP1 and the first shielding pattern GP1 are shown as having vertically straight side surfaces, this is merely illustrative. The first line LP1 and the first shielding pattern GP1 may have inclined side surfaces.

The second pattern portion PP2 may include a second line LP2 disposed in the heat-dissipating member 470 and a second shielding pattern GP2 disposed in the shielding member 450_1. The second line LP2 and the second shielding pattern GP2 may overlap each other in the thickness direction (e.g., z-axis direction). The second wiring LP2 and the second shielding pattern GP2 may have the same width, but the present invention is not limited thereto. For example, the second wiring LP2 and the second shielding pattern GP2 may have different widths. Although the second line LP2 and the second shielding pattern GP2 are shown as having vertical side surfaces, this is merely illustrative. The second line LP2 and the second shielding pattern GP2 may have inclined side surfaces.

The first electrode 510a of the sound generator 500 may be disposed such that it overlaps with at least one end of the first pattern portion PP1 in the thickness direction (e.g., z-axis direction). The second electrode 510b of the sound generator 500 may be disposed such that it overlaps with at least one end of the second pattern portion PP2 in the thickness direction (e.g., z-axis direction).

A fourth adhesive member 940 is disposed between the sound generator 500 and the heat-dissipating member 470. The conductive particles 940b may be disposed at the portions of the fourth adhesive member 940 that may overlap the first pattern portion PP1, the second pattern portion PP2 and the area between the first pattern portion PP1 and tare second pattern portion PP2. For example, the conductive particles 940b may overlap an opening between the first pattern portion PP1 and the second pattern portion PP2. Accordingly, the first line LP1 of the first pattern portion PP1 may be electrically connected to the first electrode 510a of the sound generator 500. The second line LP2 of the second pattern portion PP2 may be electrically connected to the second electrode 510b of the sound generator 500.

The first pad PAD1 of the pad unit 350 is electrically connected to the other end of the first pattern portion PP1, and the second pad PAD2 of the pad unit 350 is electrically connected to the other end of the second pattern portion PP2. The third pad PAD3 of the pad unit 350 is grounded to the base BAP.

As described above, the first electrode 510a and the second electrode 510b of the sound generator 500 can be electrically connected to the display circuit board 310 through the first line LP1 and the second line LP2 patterned on the cover panel member 400_1 even without a sound circuit board.

Figure 18:
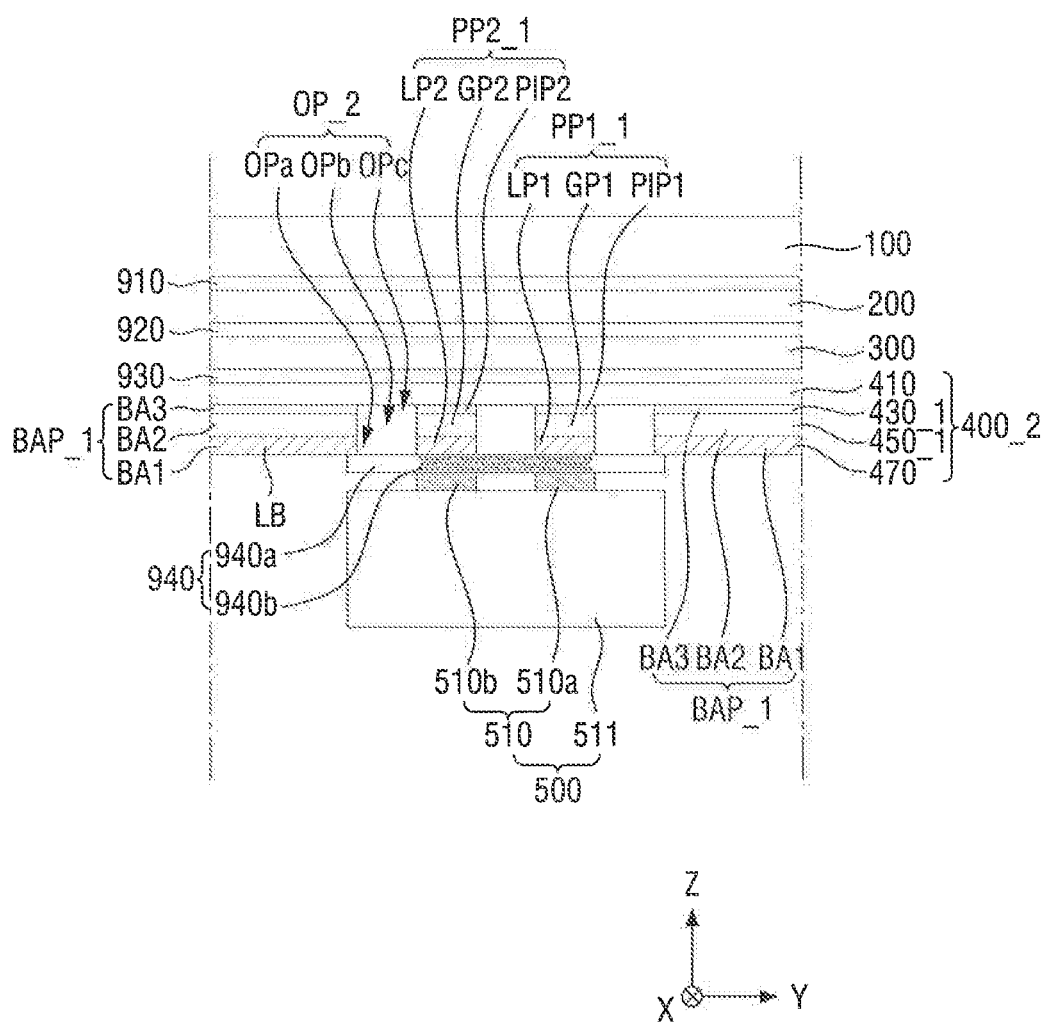
FIG. 18 is a cross-sectional view showing a connection relationship between a sound generator and a cover panel member according to an exemplary embodiment of the present invention.
Figure 19:
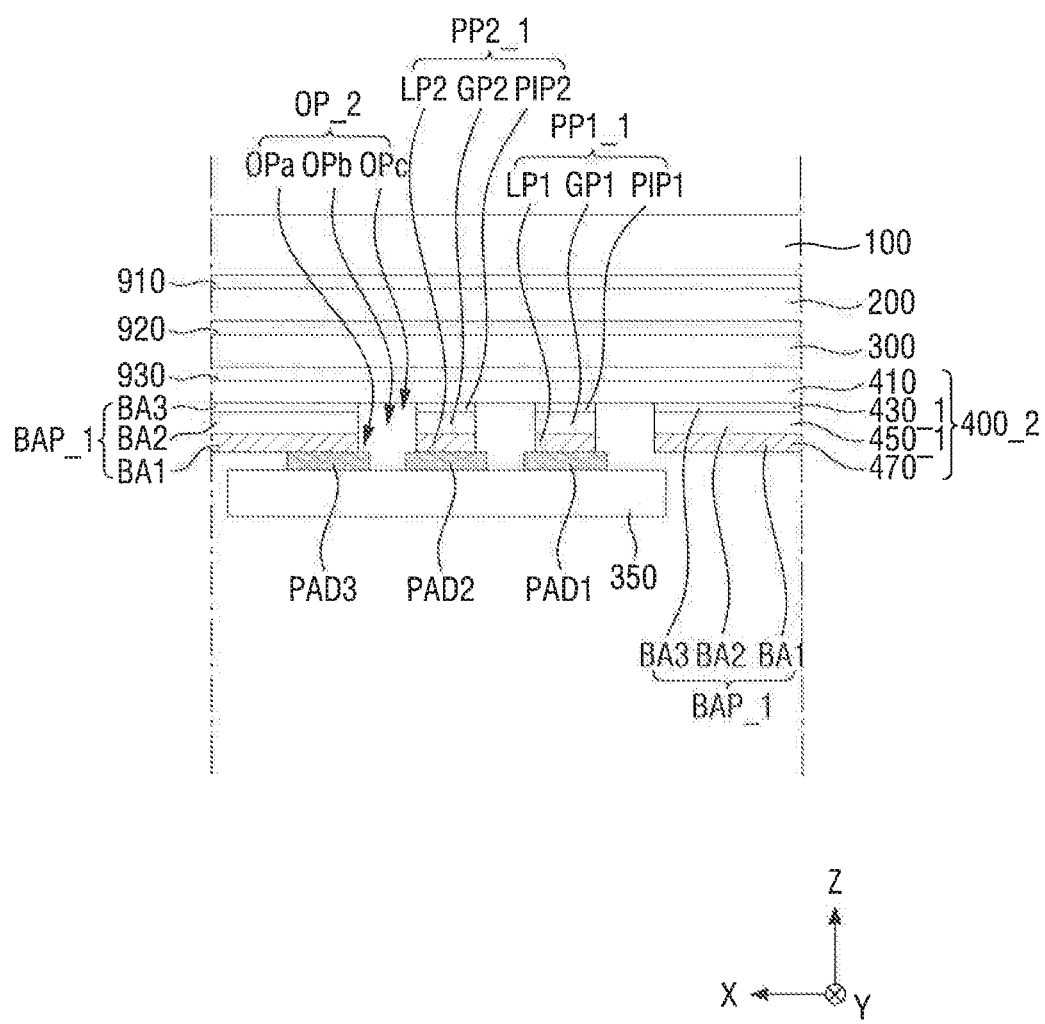
FIG. 19 is a cross-sectional view showing a connection relationship between a display circuit board and a cover panel member of a display device according to an exemplary embodiment of the present invention.

FIG. 18 is a cross-sectional view showing a connection relationship between a sound generator and a cover panel member according to an exemplary embodiment of the present invention. FIG. 19 is a cross-sectional view showing a connection relationship between a display circuit board and a cover panel member of a display device according to an exemplary embodiment of the present invention. A cover panel member 400_2 of FIGS. 18 and 19 is different from that of the exemplary embodiment shown in FIGS. 16 and 17 in that an opening OPc is further formed in a film layer 430_1. Description will focus on differences, and the redundant description may be omitted.

As shown in FIGS. 18 and 19, the cover panel member 400_2 may include a buffer member 410, a film layer 430_1, a shielding member 450_1, and a heat-dissipating member 470. The film layer 430_1, the shielding member 450_1 and the heat-dissipating member 470 may include a base BAP_1, an opening OP_2, and pattern portions PP1_1 and PP2_1.

The base BAP_1 may include a first base BA1, a second base BA2 and a third base BA3. The first base BA1 may be a part of the heat-dissipating member 470, the second base BA2 may be a part of the shielding member 450_1, and the third base BA3 may be a part of the film layer 430_1. The first base BA1, the second base BA2 and the third base BA3 may overlap one another in the thickness direction (e.g., z-axis direction).

The opening OP_2 may include a first opening OPa formed in the heat-dissipating member 470, a second opening OPb formed in the shielding member 450_1 and a third opening OPc formed in the film layer 430_1. The first opening OPa, the second opening OPb and the third opening OPc may overlap one another in the thickness direction (e.g., z-axis direction). The buffer member 410 may be exposed via the opening OP_2.

The first pattern portion PP1_1 may include a first line LP1 disposed in the heat-dissipating member 470, a first shielding pattern GP1 disposed in the shielding member 450_1, and a first film pattern PIP1 disposed in the film layer 430_1. The first line LP1, the first shielding pattern GP1 and the first film pattern PIP1 may overlap each other in the thickness direction (e.g., z-axis direction).

The second pattern portion PP2_1 may include a second line LP2 disposed in the heat-dissipating member 470, a second shielding pattern GP2 disposed in the shielding member 450_1, and a second film pattern PIP2 disposed in the film layer 430_1. The second line LP2, the second shielding pattern GP2 and the second film pattern PIP2 may overlap each other in the thickness direction (e.g., z-axis direction).

In this manner, as the opening OP_2 includes the first opening OPa formed in the heat-dissipating member 470, the second opening OPb formed in the shielding member 450_1 and the third opening OPc formed in the film layer 430_1, it is possible to effectively prevent a short-circuit from being created among the first line LP1, the second line LP2, and the base BAP_1.

Figure 20:
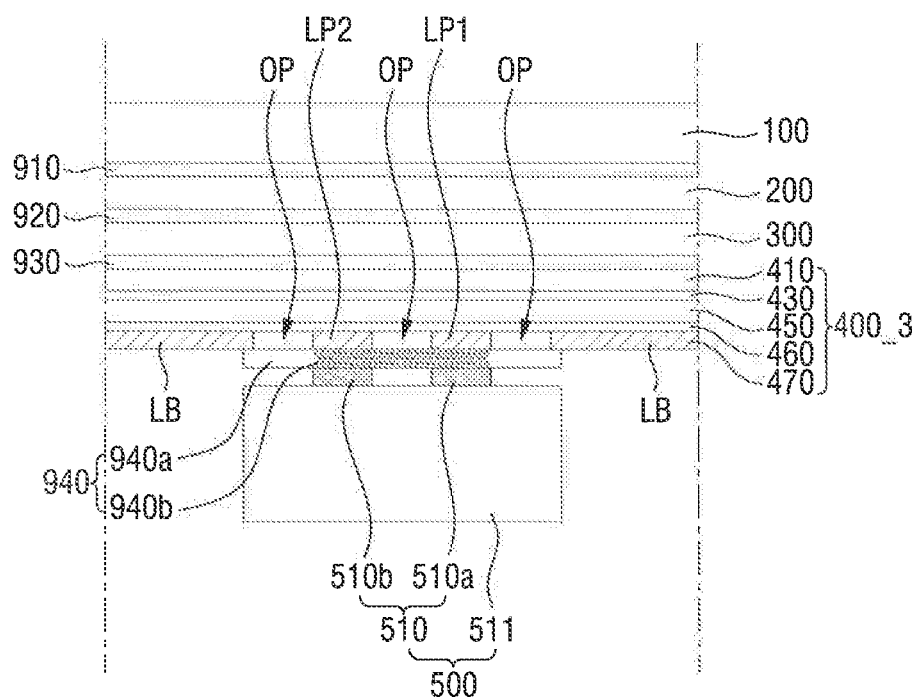
FIG. 20 is a cross-sectional view showing a connection relationship between a sound generator and a cover panel member according to an exemplary embodiment of the present invention.
Figure 21:
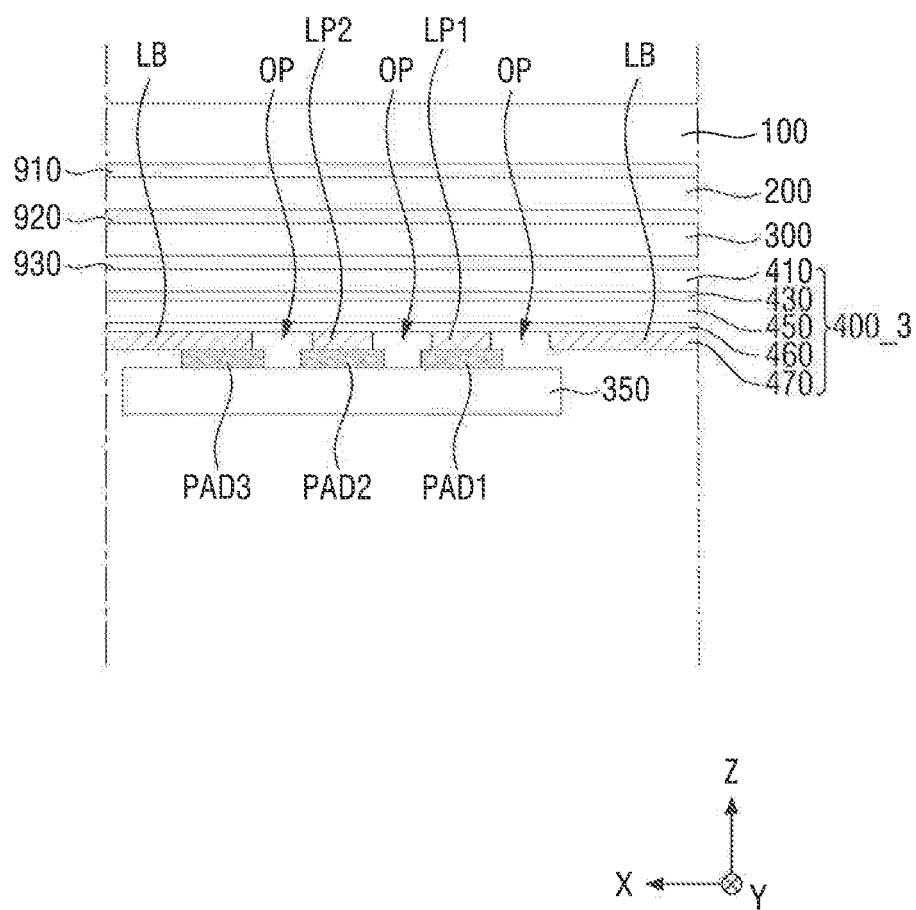
FIG. 21 is a cross-sectional view showing a connection relationship between a display circuit board and a cover panel member of a display device according to an exemplary embodiment of the present invention.

FIG. 20 is a cross-sectional view showing a connection relationship between a sound generator and a cover panel member according to an exemplary embodiment of the present invention. FIG. 21 is a cross-sectional view showing a connection relationship between a display circuit board and a cover panel member of a display device according to an exemplary embodiment of the present invention. A cover panel member 400_3 shown in FIGS. 20 and 21 is substantially identical to that of FIGS. 8 and 9 except that a second film layer 460 made of the same material as the first film layer 430 is disposed between a buffer member 450 and the heat-dissipating member 470; therefore, the redundant description may be omitted.

Figure 22:
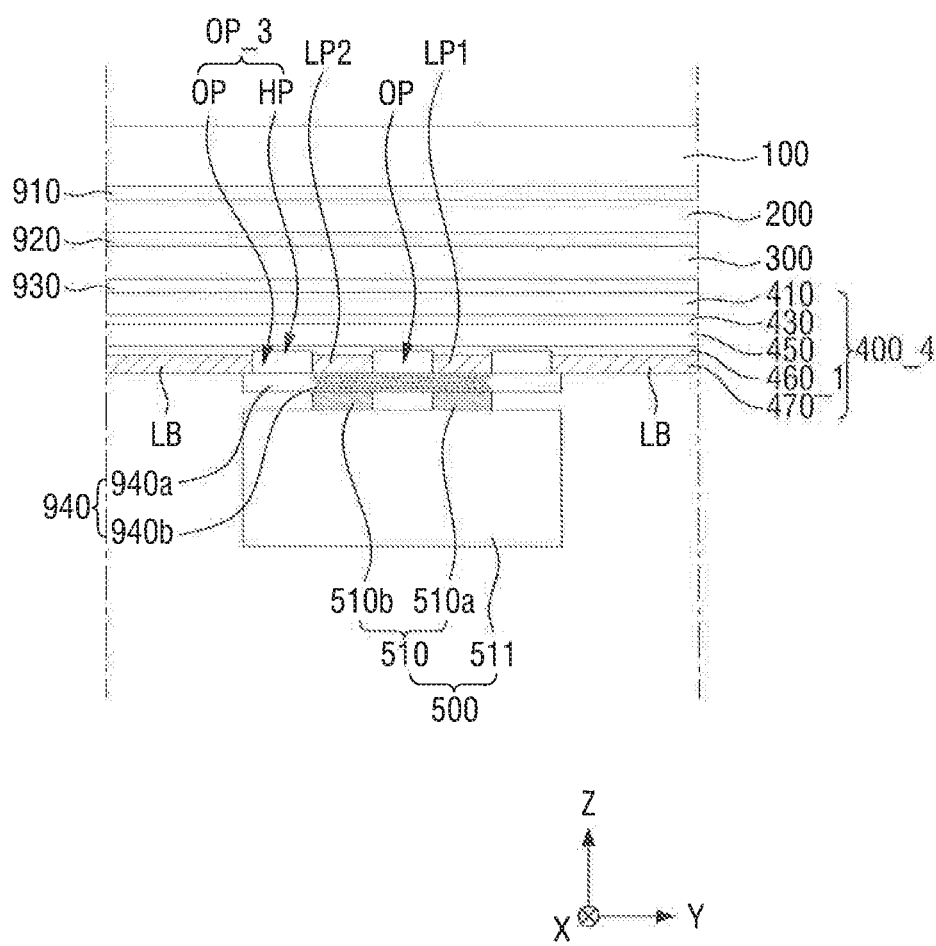
FIG. 22 is a cross-sectional view showing a connection relationship between a sound generator and a cover panel member according to an exemplary embodiment of the present invention.
Figure 23:
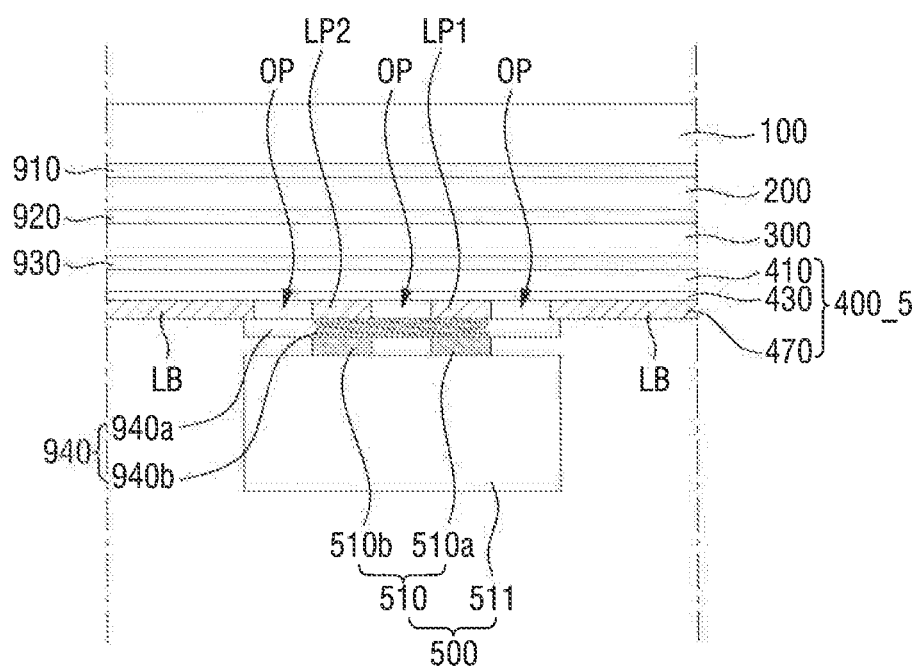
FIG. 23 is a cross-sectional view showing a connection relationship between a display circuit board and a cover panel member of a display device according to an exemplary embodiment of the present invention.

FIG. 22 is a cross-sectional view showing a connection relationship between a sound generator and a cover panel member according to an exemplary embodiment of the present invention. FIG. 23 is a cross-sectional view showing a connection relationship between a display circuit board and a cover panel member of a display device according to an exemplary embodiment of the present invention. The cover panel member 400_4 of FIGS. 22 and 23 is substantially identical to that of the exemplary embodiment of FIGS. 20 and 21 except that a pattern groove HP is formed in a second film layer 460; therefore, the redundant description may be omitted.

As shown in FIGS. 22 and 23, the opening OP_3 may include a first opening OP formed in the heat-dissipating member 470 and a pattern groove HP formed in a second film layer 460_1. The first opening OP and the pattern groove HP may overlap each other in the thickness direction (e.g., z-axis direction). The first opening OP and the pattern groove HP may have the same width, but the present invention is not limited thereto. The first opening OP and the pattern groove HP may have different widths. In addition, although the side surfaces of the first opening OP and the pattern groove HP are shown as being vertical (e.g., perpendicular to an upper surface of the fourth adhesive member 940), this is merely illustrative. For example, the first opening OP and the pattern groove HP may have inclined side surfaces.

As described above, by disposing the second film layer 460_1 and forming the pattern groove HP in the second film layer 460_1, it is possible to effectively prevent short-circuit from being created among the first line LP1, the second line LP2 and the base portion LB and to prevent damage to the shielding member 450.

Figure 24:
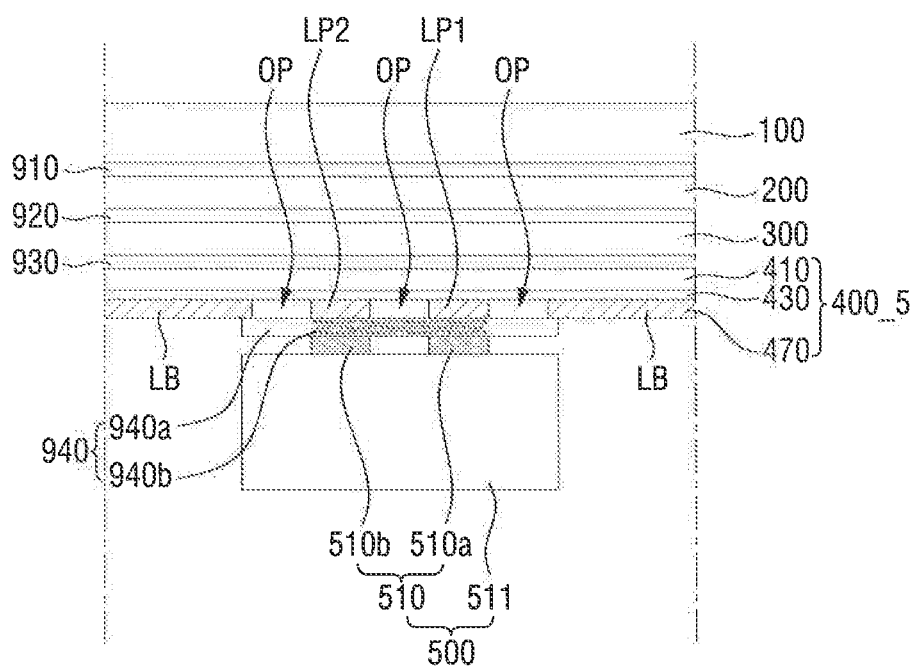
FIG. 24 is a cross-sectional view showing a connection relationship between a sound generator and a cover panel member according to an exemplary embodiment of the present invention.
Figure 25:
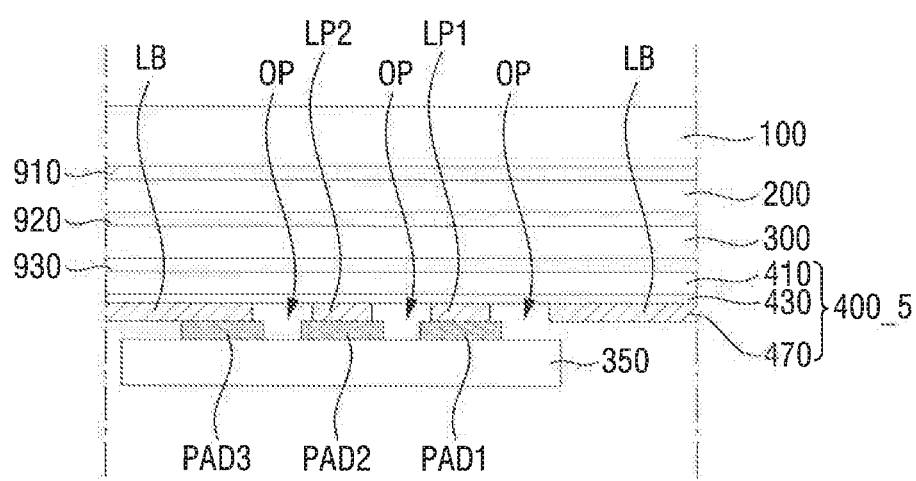
FIG. 25 is a cross-sectional view showing a connection relationship between a display circuit board and a cover panel member of a display device according to an exemplary embodiment of the present invention.

FIG. 24 is a cross-sectional view showing a connection relationship between a sound generator and a cover panel member according to an exemplary embodiment of the present invention. FIG. 25 is a cross-sectional view showing a connection relationship between a display circuit board and a cover panel member of a display device according to an exemplary embodiment of the present invention. The cover panel member 400_5 of FIGS. 24 and 25 is substantially identical to that of the exemplary embodiment of FIGS. 8 and 9 except that the shielding member is eliminated so that the thickness of the cover panel member 400_5 can be reduced; therefore, the redundant description may be omitted.

Figure 26:
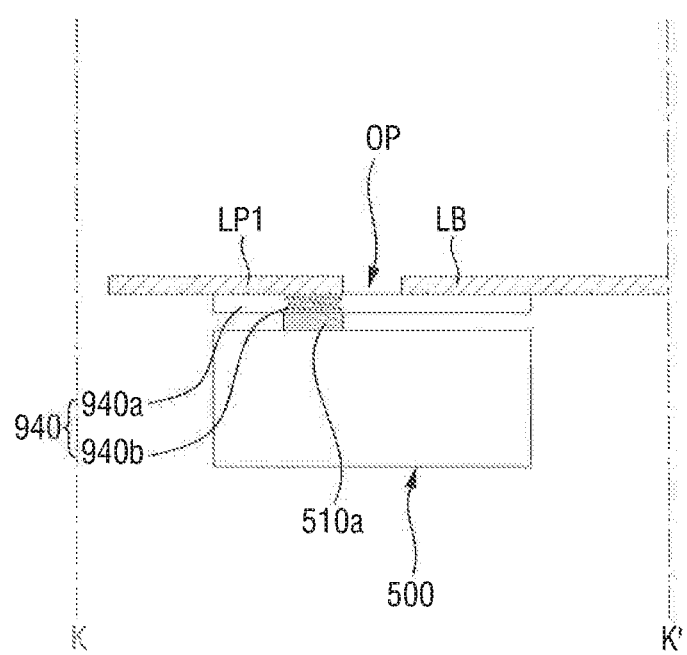
FIG. 26 is a cross-sectional view taken along line K-K' of FIG. 12, according to an exemplary embodiment of the present invention.

FIG. 26 is a cross-sectional view taken along line K-K' of FIG. 12 according to an exemplary embodiment of the present invention.

As shown in FIG. 26, the sound generator 500 is disposed under the first line LP1 and the base portion LB of the heat-dissipating member 400, and the sound generator 500 may be fixed to the first line LP1 and the base portion LB by a fourth adhesive member 940. For example, the first line LP1 and the base portion LB are attached to the upper surface of the fourth adhesive member 940, and the first electrode 510a of the sound generator 500 is attached to the lower surface of the fourth adhesive member 940. For example, the fourth adhesive member 940 may be an anisotropic conductive film (ACF) including a binder 940a and conductive particles 940b. The conductive particles 940b may be disposed in a part of the fourth adhesive member 940 overlapping with the first electrode 510a. For example, the conductive particles 940b may not be disposed in the entire area of the fourth adhesive member 940. This is to prevent the first electrode 510a of the sound generator 500 from being grounded to the base portion LB which may occur if the conductive particles 940b are disposed in the entire area of the fourth adhesive member 940. In addition, the second line LP2 is attached to the upper surface of the fourth adhesive member 940, the second electrode 510b is attached to the lower surface of the fourth adhesive member 940, and conductive particles 940b are disposed in the area of the fourth adhesive member 940 that overlaps with the second electrode 510b.

Figure 27:
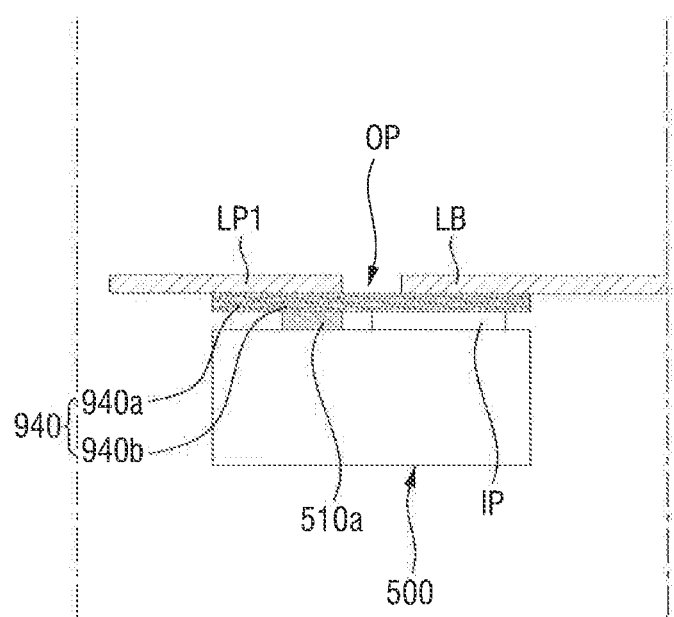
FIG. 27 is a cross-sectional view taken along line K-K' of FIG. 12, according to an exemplary embodiment of the present invention.

FIG. 27 is a cross-sectional view taken along line K-K' of FIG. 12 according to an exemplary embodiment of the present invention.

As shown in FIG. 27, the conductive particles 940b may be disposed over the entire area of the fourth adhesive member 940. An insulating layer IP may be disposed between the fourth adhesive member 940 overlapping the base portion LB and the sound generator 500 to prevent the electrode 510a of the sound generator 500 from being grounded to the base portion LB. It is, however, to be understood that the present invention is not limited thereto. The insulating layer IP may be disposed between the fourth adhesive member 940 and the base portion LB and may overlap the base portion LB. In an exemplary embodiment of the present invention, the insulating layer IP may be disposed between the fourth adhesive member 940 and the base portion LB and between the fourth adhesive member 940 and the sound generator 500 while overlapping the base portion LB.

Figure 28:
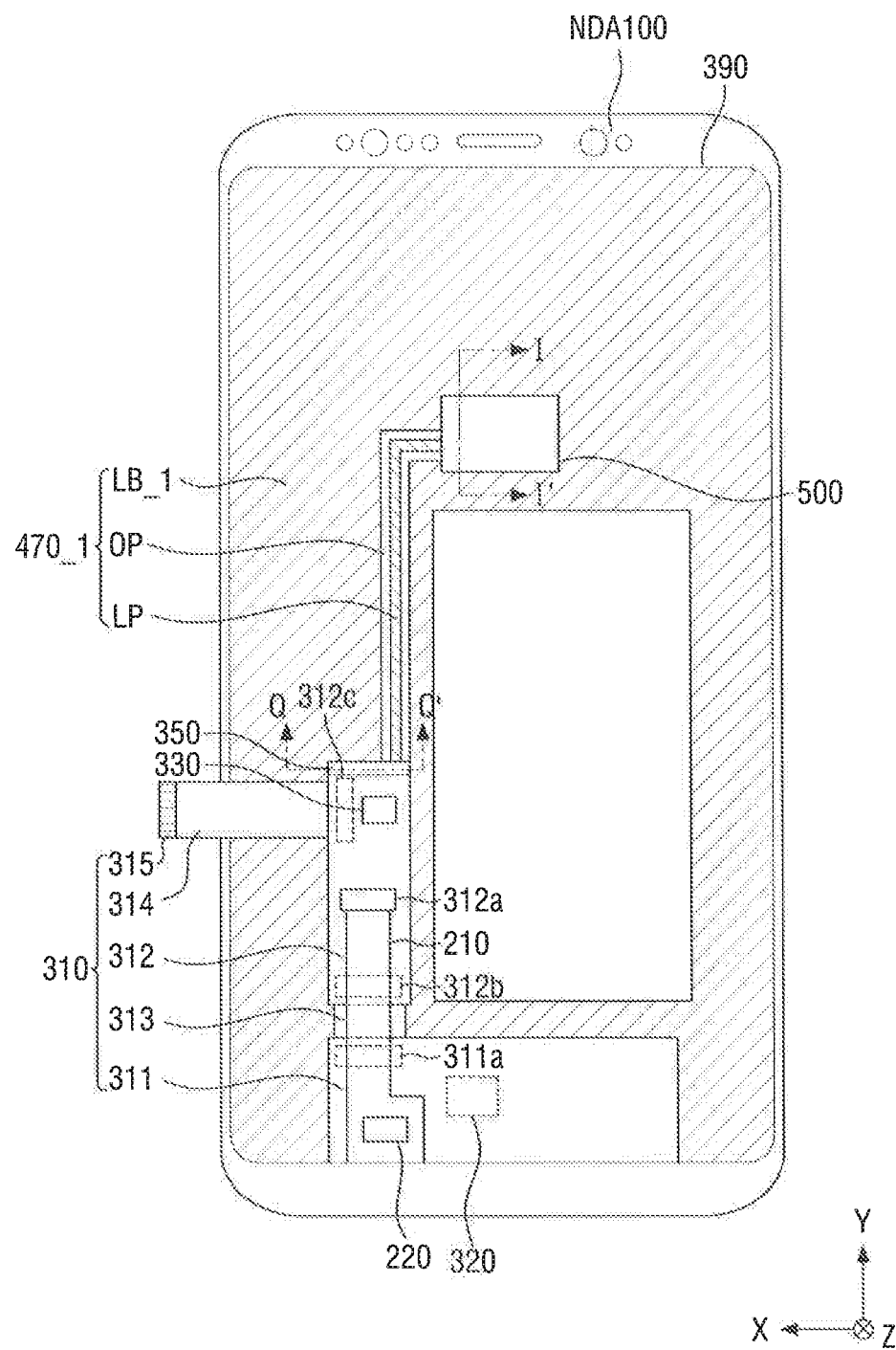
FIG. 28 is a lower view showing a cover window, a touch circuit board, a display panel, a display circuit board, a cover panel member, and a sound generator according to an exemplary embodiment of the present invention.
Figure 29:
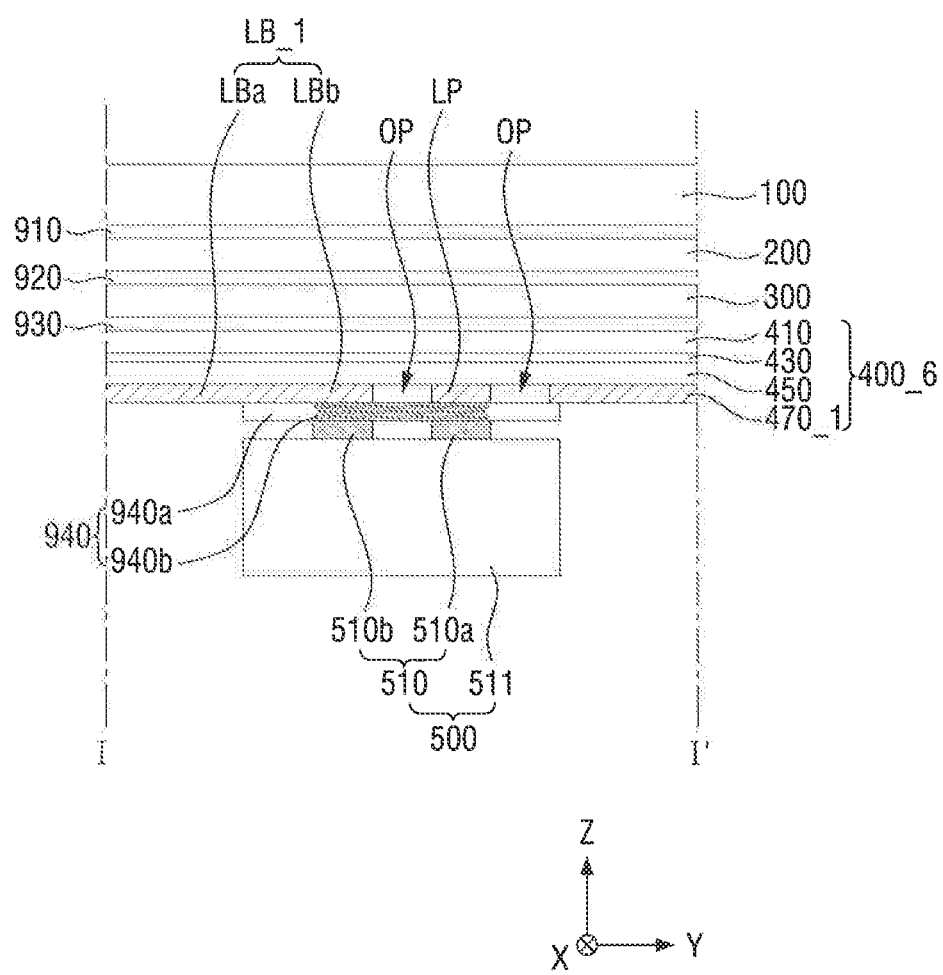
FIG. 29 is a cross-sectional view taken along line I-I' of FIG. 28, according to an exemplary embodiment of the present invention.
Figure 30:
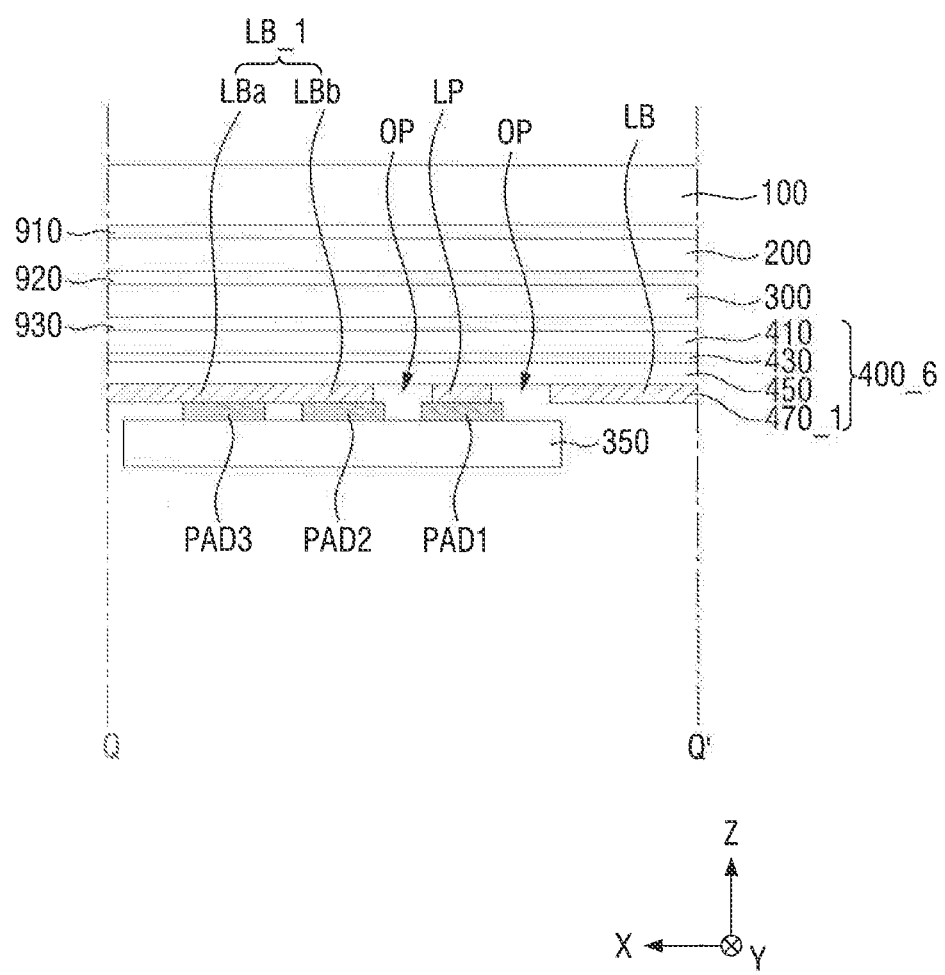
FIG. 30 is a cross-sectional view taken along line Q-Q of FIG. 28, according to an exemplary embodiment of the present invention.

FIG. 28 is a lower view showing a cover window, a touch circuit board, a display panel, a display circuit board, a cover panel member, and a sound generator according to an exemplary embodiment of the present invention. FIG. 29 is a cross-sectional view taken along line I-I' of FIG. 28 according to an exemplary embodiment of the present invention. FIG. 30 is a cross-sectional view taken along line Q-Q' of FIG. 28 according to an exemplary embodiment of the present invention.

The exemplary embodiment of FIGS. 28 to 30 is different from the exemplary embodiments of FIGS. 3, 8 and 9 in that only a single line LP is disposed in the cover panel member 400_6. Descriptions will focus on differences, and the redundant description may be omitted.

It should be noted that FIGS. 29 and 30 are the cross-sectional views of FIG. 28 in which the cover window 100 is shown at the top.

As shown in FIG. 28, a heat-dissipating member 470_1 may include a base portion LB_1, openings OP, and a single line LP.

For example, the openings OP separate the base portion LB_1 from the line LP, and the line LP is formed in the openings OP. For example, the openings OP may surround the line LP. As a result, the line LP is not electrically connected to the base portion LB_1, and different voltages may be applied thereto. For example, a driving voltage may be applied to the line LP while a ground voltage may be applied to the base portion LB_1. It is, however, to be understood that this is merely illustrative.

One end of the line LP may be connected to the sound generator 500, and the other end of the line LP may be connected to the pad unit 350.

For example, referring to FIG. 29, the sound generator 500 may include a vibration layer 511, a first electrode 510a, and a second electrode 510b. The first electrode 510a and the second electrode 510b may be in contact with the fourth adhesive member 940.

The fourth adhesive member 940 may be in contact with a base portion LB_1 and a line LP of a heat-dissipating member 470_1. The base portion LB_1 may include a first portion LBa and a second portion LBb. The first electrode 510a of the sound generator 500 and the line LP of the heat-dissipating member 470_1 may overlap each other in the thickness direction (e.g., z-axis direction). The second electrodes 510b of the sound generator 500 and the second line LP2 of the heat-dissipating member 470 may overlap each other in the thickness direction (e.g., z-axis direction). As used herein, the second portion LBb of the base portion LB_1 is a portion overlapping with the second electrode 510b in the thickness direction (e.g., z-axis direction). The remaining portion of the base portion LB_1 excluding the second portion LBb is the first portion LBa.

The conductive particles 940b of the fourth adhesive member 940 may overlap with the first electrode 510a of the sound generator 500 and the line LP of the heat-dissipating member 470_1 in the thickness direction (e.g., z-axis direction). The conductive particles 940b of the fourth adhesive member 940 may overlap with the second electrode 510b of the sound generator 500 and the second portion LBb of the base portion LB_1 in the thickness direction (e.g., z-axis direction). Accordingly, the first electrode 510a of the sound generator 500 is electrically connected to the line LP, and the second electrode 510b of the sound generator 500 is grounded to the base portion LB.

Referring to FIG. 30, the pad unit 350 of the display circuit board 310 may include a plurality of pads. For example, the pad unit 350 may include a first pad PAD1, a second pad PAD2, and a third pad PAD3. The first pad PAD1 of the pad unit 350 may be disposed such that it overlaps with the line LP1 of the heat-dissipating member 470 in the thickness direction (e.g., z-axis direction). The first pad PAD1 and the line LP may be electrically connected to each other and may receive the first driving voltage from the sound driver 330 and may transmit the first driving voltage to the line LP.

The second pad PAD2 and the third pad PAD3 of the pad unit 350 may be connected to a part of the base portion LB_1. The second pad PAD2 and the third pad PAD3 may be grounded to the base portion LB_1. Accordingly, the driving voltage is transmitted to the first electrode 510a of the sound generator 500 through the line LP. The second electrode 510b of the sound generator 500 is grounded to the base portion LB_1.

When the driving voltage applied to the first electrode 510a is alternately repeated between the negative polarity and positive polarity with reference to the ground voltage of the second electrode 510b, the vibration layer 511 repeatedly contracts and expands. As a result, the sound generator 500 vibrates, and it is possible to output sound by transmitting the driving voltage through the single line LP patterned in the heat-dissipating member 470 without a sound circuit board.

According to an exemplary embodiment of the present invention, a display device may output sound by using a sound generator that is not exposed to the outside of the display device.

While the present invention has been particularly shown and described with reference to exemplary embodiments thereof, it will be apparent to those of ordinary skill in the art that various changes in form and detail may be made thereto without departing from the spirit and scope of the present invention.

What is claimed is:

1. A display device comprising:
   a display panel;
   a heat-dissipating member disposed on the display panel and comprising a conductive metal;
   a sound generator disposed on the heat-dissipating member and generating sound by vibrating the display panel and the heat-dissipating member;
   a display circuit board disposed on the heat-dissipating member, wherein the heat-dissipating member comprises openings and a first line formed in the openings, and the first line electrically connects the sound generator with the display circuit board, wherein the first line includes the same material as the conductive metal of the heat-dissipating member;
   a buffer member disposed between the display panel and the sound generator,
   wherein the buffer member has a greater width than the sound generator, and
   wherein the buffer member covers the openings,
   wherein the heat-dissipating member is disposed between the buffer member and an uppermost surface of the sound generator; and
   a shielding member disposed between the buffer member and the heat-dissipating member, wherein the shielding member is spaced apart from the sound generator.

2. The display device of claim 1, wherein the first line has a shape corresponding to a shape of the openings.

3. The display device of claim 2, wherein the heat-dissipating, member further comprises a base portion spaced apart from the first line, wherein the sound generator comprises a first electrode and a second electrode, wherein the first electrode is electrically connected to a first end of the first line, and the second electrode is grounded to the base portion.

4. The display device of claim 3, wherein the display circuit board comprises a plurality of pads spaced apart from one another, wherein a second end, opposite the first end, of the first line is electrically connected to a first pad of the plurality of pads, and a second pad of the plurality of pads is grounded to the base portion.

5. The display device of claim 4, wherein a driving voltage is applied to the first electrode of the sound generator through the first line, and a ground voltage is applied to the second electrode through the base portion.

6. The display device of claim 5, wherein the sound generator comprises a vibration layer disposed between the first electrode and the second electrode and is configured to contract and expand according to the driving voltage applied to the first electrode.

7. The display device of claim 1, further comprising:
   a film layer disposed between the buffer member and the heat-dissipating member, wherein the film layer comprises a pattern groove overlapping the openings,
   wherein the buffer member is disposed between the display panel and the heat-dissipating member.

8. The display device of claim 1, further comprising:
   a film layer disposed between the buffer member and the heat-dissipating member,
   wherein a shielding member is disposed between the film layer and the heat-dissipating member, wherein the shielding member comprises a hole overlapping with a first opening of the openings of the heat-dissipating member,
   wherein the buffer member is disposed between the display panel and the heat-dissipating member.

9. The display device of claim 1, further comprising:
   a middle frame disposed on the heat-dissipating member and having a through hole; and
   a main circuit board disposed on the middle frame and comprising a main connector.

10. The display device of claim 9, wherein the display circuit board further comprises a connection cable, and wherein the connection cable is connected to the main connector of the main circuit board via the through hole of the middle frame.

11. A display device comprising:
    a display panel;
    a heat-dissipating member disposed on the display panel and comprising a conductive metal;
    a sound generator disposed on the heat-dissipating member and generating sound by vibrating the display panel and the heat-dissipating member;
    a display circuit board disposed on the heat-dissipating member, wherein the heat-dissipating member comprises openings and a first line formed in the openings, and the first line electrically connects the sound generator with the display circuit board, wherein the first line has a shape corresponding to a shape of the openings, wherein the display device further comprises a plurality of lines, wherein the plurality of lines includes the first line and a second line spaced apart from the first line, the sound generator comprises a first electrode and a second electrode, and wherein first ends of the first line and the second line are electrically connected to the first electrode and the second electrode, respectively.

12. The display device of claim 11, wherein the display circuit board comprises a first pad and a second pad spaced apart from each other, and wherein second ends, opposite the first ends, of the first line and the second line are electrically connected to the first pad and the second pad, respectively.

13. The display device of claim 12, wherein the display circuit board further comprises a third pad spaced apart from the first pad and the second pad, wherein the heat-dissipating member further comprises a base portion spaced apart from the first line and the second line, and wherein the third pad is grounded to the base portion.

14. The display device of claim 13, wherein the display circuit board further comprises a sound driver configured to output a first driving voltage and a second driving voltage, wherein the first driving voltage is applied to the first electrode via the first pad and the first line, and wherein the second driving voltage is applied to the second electrode via the second pad and the second line.

15. The display device of claim 14, wherein the first electrode and the second electrode protrude from the sound generator, and wherein the sound generator comprises a vibration layer disposed between the first electrode and the second electrode and configured to contract and expand according to the first driving voltage applied to the first electrode and the second driving voltage applied to the second electrode.

16. The display device of claim 15, wherein the first electrode comprises a first stem electrode and first branch electrodes extending from the first stem electrode, and
wherein the second electrode comprises a second stem electrode and second branch electrodes extending from the second stem electrode and extending parallel to the first branch electrodes.

17. The display device of claim 16, wherein the first branch electrodes and the second branch electrodes are alternately arranged in a direction parallel to a first side of the first stem electrode.

18. The display device of claim 17, wherein an end of each of the first stem electrode and the second stem electrode protrudes out of the vibration layer.

19. The display device of claim 11, further comprising:
an anisotropic conductive film disposed between the sound generator and the beat-dissipating member.

20. The display device of claim 19, wherein the anisotropic conductive film comprises a binder and conductive particles, and wherein the conductive particles overlap the first electrode and the second electrode.

21. A display device comprising:
a display panel;
a display circuit board connected to the display panel and including a display driver and a sound driver;
a cover panel member disposed on the display panel and including a heat-dissipating member, wherein the heat-dissipating member includes a conductive metal, an opening and a first line disposed in the opening;
a sound generator disposed on the heat-dissipating member and configured to expand and contract;
a buffer member disposed between the display panel and the sound generator,
wherein the first line electrically connects the sound generator to the to the display circuit board and the sound driver,
wherein the first line is disposed between the sound generator and the display panel,
wherein the buffer member has a greater width than the sound generator, and
wherein the buffer member covers the openings,
wherein the heat-dissipating member is disposed between the buffer member and an uppermost surface of the sound generator; and
wherein a shielding member disposed between the buffer member and the heat-dissipating member, wherein the shielding member is spaced apart from the sound generator.

* * * * *